United States Patent
Hao

(10) Patent No.: US 7,976,638 B2
(45) Date of Patent: Jul. 12, 2011

(54) HIGH NEGATIVE ZETA POTENTIAL POLYHEDRAL SILSESQUIOXANE COMPOSITION AND METHOD FOR DAMAGE FREE SEMICONDUCTOR WET CLEAN

(75) Inventor: Jianjun Hao, Austin, TX (US)

(73) Assignee: Sachem, Inc., Austin, TX (US)

( * ) Notice: Subject to any disclaimer, the term of this patent is extended or adjusted under 35 U.S.C. 154(b) by 498 days.

(21) Appl. No.: 12/269,121

(22) Filed: Nov. 12, 2008

(65) Prior Publication Data

US 2009/0120458 A1    May 14, 2009

Related U.S. Application Data

(60) Provisional application No. 60/987,706, filed on Nov. 13, 2007.

(51) Int. Cl.
| C25F 1/00 | (2006.01) |
| C25F 3/00 | (2006.01) |
| C23G 1/14 | (2006.01) |
| C11D 3/08 | (2006.01) |
| C11D 7/14 | (2006.01) |
| C11D 7/18 | (2006.01) |

(52) U.S. Cl. ........ 134/1.3; 134/2; 134/22.14; 134/22.19; 510/175; 510/176; 510/367; 510/372; 510/466; 510/504; 423/325

(58) Field of Classification Search ........... 510/175, 510/176, 367, 372, 466, 504; 134/1.3, 2, 134/22.14, 22.19; 423/325
See application file for complete search history.

(56) References Cited

U.S. PATENT DOCUMENTS

| 5,047,492 A | 9/1991 | Weidner et al. ............. 528/15 |
| 5,466,389 A | 11/1995 | Ilardi et al. ............. 252/156 |
| 5,561,105 A | 10/1996 | Honda ............. 510/178 |
| 5,759,973 A | 6/1998 | Honda et al. ............. 510/176 |
| 5,817,610 A | 10/1998 | Honda et al. ............. 510/176 |
| 5,935,871 A | 8/1999 | Farkas et al. ............. 438/693 |
| 6,020,292 A | 2/2000 | Honda et al. ............. 510/175 |
| 6,066,609 A | 5/2000 | Martin et al. ............. 510/175 |
| 6,261,466 B1 | 7/2001 | Bayes et al. ............. 216/13 |
| 6,465,403 B1 | 10/2002 | Skee ............. 510/175 |

(Continued)

FOREIGN PATENT DOCUMENTS
WO    2007/044446 A1    4/2007

OTHER PUBLICATIONS

"Zeta Potential: A Complete Course in 5 Minutes"; Zeta-Meter, Inc.; 8 pages; date unknown.

(Continued)

*Primary Examiner* — Brian P Mruk
(74) *Attorney, Agent, or Firm* — Renner, Otto, Boisselle & Sklar, LLP

(57) ABSTRACT

A composition for removing particulate matter from integrated circuit substrates, including (a) one or more metal ion-free base; (b) a water-soluble metal ion-free onium salt of a polyhedral silsesquioxane; (c) an oxidizing agent; and (d) metal ion-free water, and a composition obtained by combining ingredients including (a), (b), (c) and (d). A process for removing particulate matter from a surface of an integrated circuit device, including applying to the surface the composition including (a), (b), (c) and (d) or applying to the surface the composition obtained by combining ingredients including (a), (b), (c) and (d).

47 Claims, 23 Drawing Sheets

U.S. PATENT DOCUMENTS

| | | | |
|---|---|---|---|
| 6,475,966 B1 | 11/2002 | Sahbari | 510/175 |
| 6,554,912 B2 | 4/2003 | Sahbari | 134/26 |
| 6,585,825 B1 * | 7/2003 | Skee | 134/3 |
| 6,599,370 B2 | 7/2003 | Skee | 134/3 |
| 6,794,305 B2 | 9/2004 | Funabashi | 438/745 |
| 2004/0220065 A1 | 11/2004 | Hsu | 510/175 |
| 2004/0220066 A1 | 11/2004 | Rutter, Jr. | 510/175 |
| 2005/0142054 A1 | 6/2005 | Hasegawa et al. | 423/325 |
| 2005/0197265 A1 | 9/2005 | Rath et al. | 510/175 |
| 2005/0227893 A1 | 10/2005 | Johnson et al. | 510/367 |
| 2006/0089280 A1 | 4/2006 | Vos et al. | 510/175 |
| 2006/0113506 A1 | 6/2006 | Man et al. | 252/186.1 |
| 2006/0226122 A1 | 10/2006 | Wojtczak | 216/83 |

OTHER PUBLICATIONS

Singer; "Damage During Cleans Evaluated by AFM"; Seminconductor International; Nov. 7, 2007; 2 pp.

Kinrade et al.; "Silicon 29 NMR Studies of Tetraalkylammonium Silicate Solutions. 1. Equilibria, $^{29}$Si Chemical Shifts, and $^{29}$Si Relaxation"; *Inorg. Chem.*; 1998, 37, pp. 4272-4277.

Hoebbel et al.; "Di Konstitution des tetramethylammoniumsilicats der Zusammensetzung 1,0 N(CH$_3$)$_4$OH •1,0 SiO$_2$ •8,0-8,3 H$_2$O"; *Z. anorg. allg. Chem.* 384, 43-52; 1971.

Busnaina et al.; "Ultrasonic and Megasonic Particle Removal"; Precision Cleaning '95 Proceedings; pp. 347-360.

Busnaina et al.; "Nano and Microscale Particle Removal"; Northeastern University; Microcontamination Research Lab; Date Unknown; 23 pages.

Chen et al.; "Mechanism of Particle Deposition on Silicon Surface during Dilute HF Cleans"; *Journal of The Electrochemical Society*, 150 (11) G667-G672; 2003.

International Search Report and Written Opinion of International Searching Authority; Application No. PCT/US2008/083161; mailed Apr. 21, 2009.

* cited by examiner

HIGH NEGATIVE ZETA POTENTIAL POLYHEDRAL SILSESQUIOXANE COMPOSITION AND METHOD FOR DAMAGE FREE SEMICONDUCTOR WET CLEAN

CROSS-REFERENCE TO RELATED APPLICATION

The present application relates to and claims benefit under 35 U.S.C. §119(e) to U.S. Provisional Application No. 60/987,706, filed 13 Nov. 2007, the entirety of which is hereby incorporated herein by reference as if fully reproduced herein.

TECHNICAL FIELD

The present invention relates to compositions including an onium salt polyhedral silsesquioxane and methods for use of the compositions in wet cleaning of semiconductor substrates, and more specifically to the use of a water-soluble metal ion-free polyhedral silsesquioxane onium salt in a high pH solution for cleaning semiconductor substrates, which is especially useful for removal of nano-sized particles from such substrates.

BACKGROUND

During semiconductor fabrication, many processes are applied which can result in the formation of very fine, nanometer-scale particles ("nano particles"). These very small nano particles can be very difficult to remove effectively, due to the small size and relatively high surface adhesion forces present. Known semiconductor cleaning compositions, such as ammonia-peroxide-water, which is known as SC-1, "standard clean 1", are generally either not capable of removing nano particles or are not capable of removing these particles without damaging the semiconductor surfaces and structures adjacent the particles. The need to effectively remove nano particles from semiconductor surfaces has become more urgent as device dimensions continue to be reduced. The difficulty in removing the nano particles has also become more difficult due to the small size of the particles and to the increased unacceptability of damage to semiconductor surfaces and structures as the device dimensions continue to be reduced. It is important to achieve both goals, the goal of removing nano particles and the goal of avoiding damage to semiconductor surfaces and structures in the area being cleaned. Therefore a continuing need exists for improved compositions and methods for providing such damage-free, effective removal of nano particles from semiconductor devices.

SUMMARY

The present invention provides a solution to the problem and answers the continuing need for improved compositions and methods for providing such damage-free, effective removal of nano particles from semiconductor devices.

In one embodiment, the present invention relates to a composition for removing particulate matter from integrated circuit substrates, including:
(a) one or more metal ion-free base;
(b) a water-soluble metal ion-free salt of a polyhedral silsesquioxane;
(c) an oxidizing agent and
(d) metal ion-free water.

In another embodiment, the present invention further relates to a composition for removing particulate matter from integrated circuit substrates, including:
(a) one or more metal ion-free base;
(b) a water-soluble metal ion-free onium salt of a polyhedral silsesquioxane, wherein the onium has a general formula:

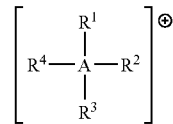

wherein each of $R^1$, $R^2$, $R^3$ and $R^4$ is independently H, an alkyl, alkoxy or alkanol $C_1$-$C_{18}$ group, and A=N or P;
(c) an oxidizing agent; and
(d) metal ion-free water.

In another embodiment, the present invention further relates to a composition for removing particulate matter from integrated circuit substrates, including:
(a) one or more metal ion-free base;
(b) a water-soluble metal ion-free onium salt of a polyhedral silsesquioxane having general formula $$Si_nO_{5n/2}{}^{n-}$$

wherein n is in the range from about 6 to about 20; and
wherein the onium has a general formula:

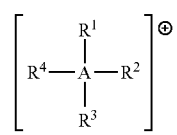

wherein each of $R^1$, $R^2$, $R^3$ and $R^4$ is independently H, an alkyl, alkoxy or alkanol $C_1$-$C_{18}$ group, and A=N or P;
(c) an oxidizing agent; and
(d) metal ion-free water.

In another embodiment, the present invention further relates to a composition for removing particulate matter from integrated circuit substrates, including:
(a) one or more metal ion-free base;
(b) a water-soluble metal ion-free onium salt of a polyhedral silsesquioxane, wherein the polyhedral silsesquioxane has a formula $Si_8O_{20}{}^{8-}$, and structure (I):

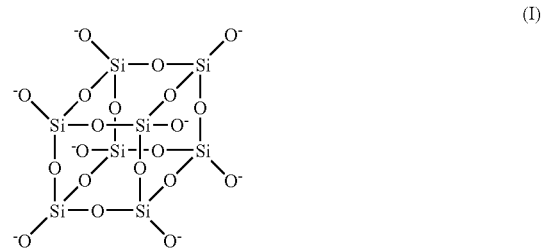

wherein the onium has a general formula (II):

wherein in (II) each of $R^1$, $R^2$, $R^3$ and $R^4$ is independently H, an alkyl, alkoxy or alkanol $C_1$-$C_{18}$ group, and A=N or P;

(c) an oxidizing agent comprising hydrogen peroxide; and (d) metal ion-free water.

In one embodiment, the composition is that obtained by combining at a temperature from about 50° C. to about 85° C. ingredients including:

(a) one or more metal ion-free base;

(b) a water-soluble metal ion-free onium salt of a polyhedral silsesquioxane;

(c) an oxidizing agent; and (d) metal ion-free water. In this embodiment, these ingredients are combined to prepare a composition for use as described herein, although the ingredients when combined may have interacted so that the resulting species are changed to some degree as a result of the combination.

In one embodiment, the water-soluble metal ion-free polyhedral silsesquioxane and/or the water-soluble metal ion-free onium salt of a polyhedral silsesquioxane have been prepared by reacting together a quaternary onium hydroxide and silicon dioxide in a substantially 1:1 stoichiometric ratio at an elevated temperature in the range from about 55° C. to about 85° C. The product of the reaction of the quaternary onium hydroxide and silicon dioxide in a substantially 1:1 stoichiometric ratio at the elevated temperature is the water-soluble metal ion-free polyhedral silsesquioxane and/or the water-soluble metal ion-free onium salt of a polyhedral silsesquioxane of the present invention and, in one embodiment, if the reaction is not carried out with a substantially 1:1 stoichiometric ratio at the elevated temperature, the water-soluble metal ion-free polyhedral silsesquioxane and/or the water-soluble metal ion-free onium salt of a polyhedral silsesquioxane of the present invention is not obtained. That is, in one embodiment, the product obtained by this reaction at this ratio and temperature is not the same as the quaternary ammonium silicates of the prior art.

Thus, in the foregoing embodiments the present invention provides a novel and effective composition useful for cleaning integrated circuit and semiconductor surfaces, and in particular for removing nano particles from such surfaces.

In additional embodiments, the present invention particularly relates to processes for cleaning surfaces of integrated circuits during front-end-of-line (FEOL) processing, in which the compositions in accordance with the invention as described above are used for this cleaning, so that the surfaces are effectively cleaned without etching one or more of dielectric materials, silicon-containing conductor and semiconductor materials, or metals. As will be recognized, of course, the compositions and processes may be favorably employed in other processes and/or at points other than FEOL in the semiconductor fabrication processes. In the processes in accordance with the invention, the foregoing compositions are applied to the surface and thereafter the surface is rinsed with metal-free water, resulting in an effective cleaning and removing of particles, including nano particles, while at the same time avoiding any substantial amount of etching of the surfaces being cleaned, i.e., avoiding a degree of etching that is detrimental to the product.

The present invention thus addresses the needs in the art for effective cleaning and particle removal compositions which are capable of providing the needed cleaning while not resulting in any substantial degree of etching of the surfaces being cleaned.

Figure 1:
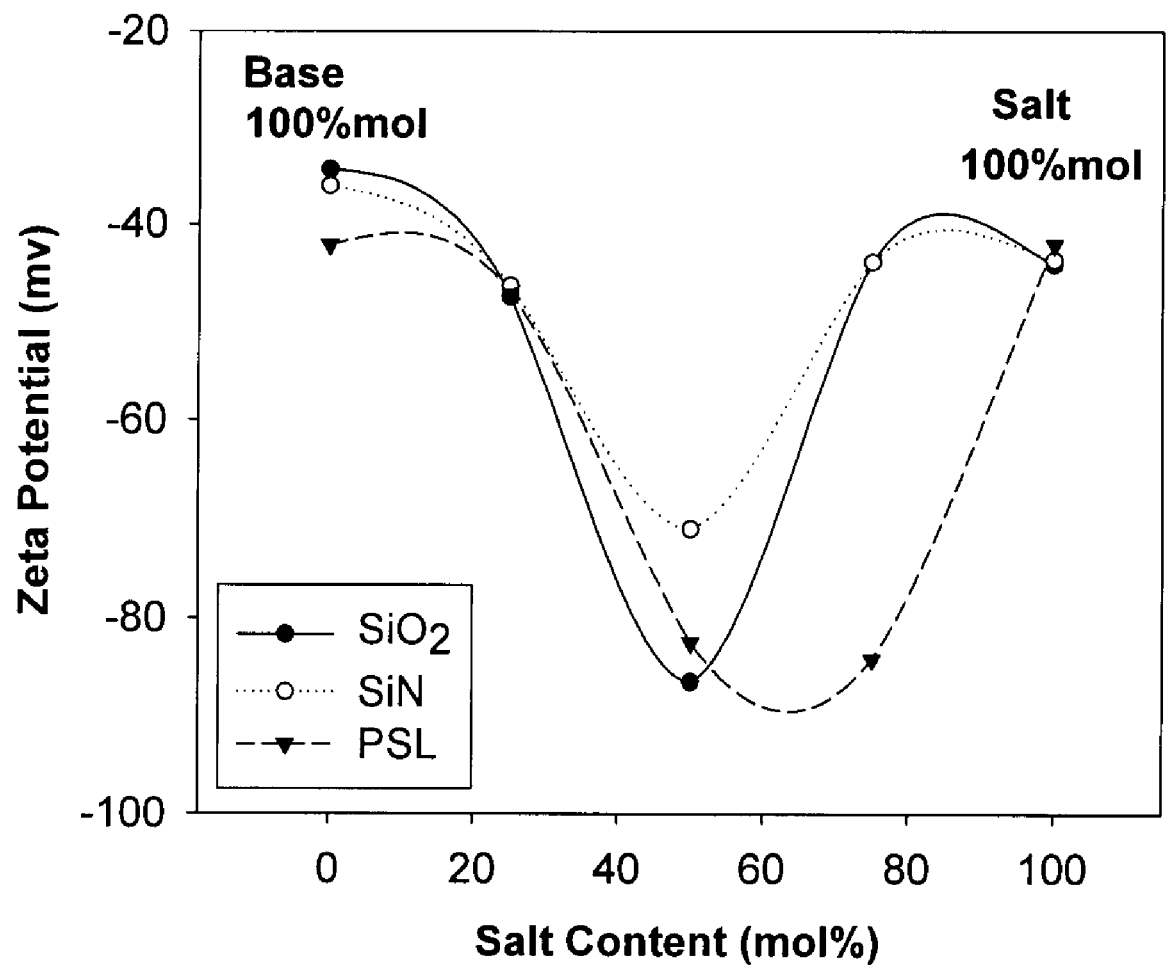
FIG. 1 is a graph illustrating the synergistic increase in negative zeta potential observed for an embodiment of a composition in accordance with the present invention.

It should be appreciated that the process steps and structures described below do not form a complete process flow for fabrication of semiconductor devices or integrated circuits. The present invention can be practiced in conjunction with fabrication techniques currently used in the art, and only so much of the commonly practiced process steps are included as are necessary for an understanding of the present invention.

DETAILED DESCRIPTION

In response to both the newly developing and the long-standing need for improved particle removal and cleaning compositions, the present inventor has developed high negative zeta potential polyhedral silsesquioxane compositions for use in semiconductor wet clean. The present invention addresses the problems of (1) providing efficient nano particle and cleaning efficiency while maintaining damage free silicon dioxide and silicon surfaces; and (2) providing enhanced zeta potential to achieve the high particle removal efficiency (PRE), particularly with respect to removal of nano particles.

The present invention employs an as-prepared polyhedral silsesquioxane onium salt in strongly basic solution in combination with an oxidizing agent for semiconductor wet clean formulation. The present inventor discovered a synergic effect between the polyhedral silsesquioxane salt and a base, which can enhance the zeta potential on particle surface and semiconductor surface, leading to high particle removal efficiency (PRE). Since the polyhedral silsesquioxane salt has a chemical structure similar to many semiconductor surfaces (e.g., silicon dioxide, silicon etc.), the formulation of the present invention, with the polyhedral silsesquioxane salt, either does not damage the semiconductor surface or minimizes any damage, attaining damage levels suitable for use with next generation ULSI device dimensions, i.e., dimensions in the nanometer range. The composition of the present invention provides for semiconductor nanoscale cleaning with damage-free performance. The composition of the present invention has advantages over currently available semiconductor clean formulations in that it (1) provides a damage free cleaning; and (2) effectively removes nano particles.

In one embodiment, the present invention relates to a composition for removing particulate matter from integrated circuit substrates, including:
  (a) one or more metal ion-free base;
  (b) a water-soluble metal ion-free onium salt of a polyhedral silsesquioxane;
  (c) an oxidizing agent; and
  (d) metal ion-free water.

In one embodiment, the composition of the present invention includes a polyhedral oligomeric silicate, referred to herein as polyhedral silsesquioxane anion, with the general formula $Si_nO_{5n/2}{}^{n-}$. In one embodiment, n has a value in the range from about 6 to about 20, In one embodiment, the polyhedral silsesquioxane anion includes structures having the formula $Si_8O_{20}{}^{8-}$, in which n=8, In many embodiments, the polyhedral silsesquioxane onium salt includes structures having the formula $Si_8O_{20}{}^{8-}$, in which n primarily has the value of 8, i.e., in a major amount of the composition n=8, but in which a mixture of other polyhedral silsesquioxane anions also are present, including n=6, 10, 12, 14, 16 and or 18.

In addition to the onium salt of a polyhedral silsesquioxane, the composition further includes a base. In one embodiment, the base is ammonium hydroxide and/or a quaternary ammonium hydroxide, such as, in one embodiment, tetramethylammonium hydroxide. Suitable bases are described herein.

In addition to the onium salt of a polyhedral silsesquioxane and the base, the composition further includes an oxidizer. In one embodiment, the oxidizer is hydrogen peroxide or other metal-free oxidizing agents, such as ammonium hypochlorite, tetramethylammonium hypochlorite, tetraethylammonium hypochlorite, etc.).

In other embodiments, the composition of the present invention may further include surfactants, chelating agents, and organic solvents.

In one embodiment, the composition of the present invention includes DI-water or other high-purity, substantially or completely metal-free water.

In most embodiments, the composition is primarily aqueous, but may include a significant portion of a water-soluble or water-miscible organic solvent. In some embodiments, the content of the organic solvent may surpass the content of water, in compositions in accordance with the present invention.

In one embodiment, the polyhedral silsesquioxane anion has the formula $Si_8O_{20}{}^{8-}$, and has a structural formula considered to be the following:

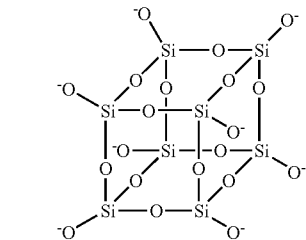

Suitable counterions for the above polyanion include any non-metal cation. In one embodiment, the non-metal cation is an onium. In one embodiment, the non-metal counterions are ammonium, quaternary ammonium or quaternary phosphonium. In one embodiment, the onium has a general formula:

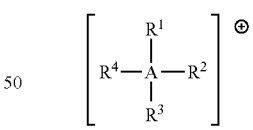

wherein each of $R^1$, $R^2$, $R^3$ and $R^4$ is independently H, an alkyl, alkoxy or alkanol $C_1$-$C_{18}$ group, and A=N or P.

Thus, in one embodiment, the present invention relates to a composition for removing particulate matter from integrated circuit substrates, including:
  (a) one or more metal ion-free base;
  (b) a water-soluble metal ion-free onium salt of a polyhedral silsesquioxane, wherein the onium has a general formula: wherein each of $R^1$, $R^2$, $R^3$ and $R^4$ is independently H, an alkyl, alkoxy or alkanol $C_1$-$C_{18}$ group, and A=N or P;
  (c) an oxidizing agent; and
  (d) metal ion-free water.

In another embodiment, the present invention relates to a composition for removing particulate matter from integrated circuit substrates, including:

(a) one or more metal ion-free base;

(b) a water-soluble metal ion-free onium salt of a polyhedral silsesquioxane having general formula

$$Si_nO_{5n/2}{}^{n-}$$

wherein n is in the range from about 6 to about 20; and wherein the onium has a general formula:

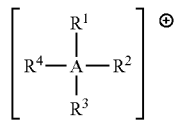

wherein each of $R^1$, $R^2$, $R^3$ and $R^4$ is independently H, an alkyl, alkoxy or alkanol $C_1$-$C_{18}$ group, and A=N or P;

(c) an oxidizing agent; and (d) metal ion-free water.

In another embodiment, the present invention relates to a composition for removing particulate matter from integrated circuit substrates, comprising:

(a) one or more metal ion-free base;

(b) a water-soluble metal ion-free onium salt of a polyhedral silsesquioxane, wherein the polyhedral silsesquioxane anion has a formula $Si_8O_{20}{}^{8-}$, and structure (I):

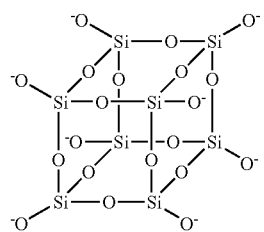

(I)

wherein the onium has a general formula (II):

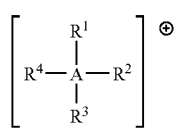

(II)

wherein in (II) each of $R^1$, $R^2$, $R^3$ and $R^4$ is independently H, an alkyl, alkoxy or alkanol $C_1$-$C_{18}$ group, and A=N or P;

(c) an oxidizing agent comprising hydrogen peroxide; and (d) metal ion-free water.

In one embodiment, the polyhedral silsesquioxane is $Si_8O_{20}{}^{8-}$, the onium is tetramethylammonium, and the onium salt of the polyhedral silsesquioxane has the structure shown below:

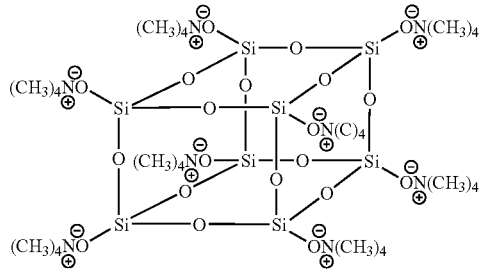

in which the negative charge on each of the eight apical oxygen atoms is balanced by the positive charge from one of the tetramethylammonium ions. It is noted that in this structure, and in all the other structures, various numbers of water molecules may be associated with the compounds and ions shown. Such water molecules are not shown for clarity, but as those of skill in the art would readily understand, are generally present.

The compositions in accordance with the present invention have a pH of 8 or greater. In one embodiment, the composition has a pH in the range from 8 to about 14, in another embodiment, the composition has a pH in the range from about 10 to about 12, and in another embodiment, the composition has a pH in the range from about 11 to about 13, and in another embodiment, the pH is in the range from about 10 to about 13.

In one embodiment, the composition comprises from about 0.1 wt. % to about 10 wt. % of the polyhedral silsesquioxane salt. In one embodiment, the composition comprises from about 0.25 wt. % to about 5 wt. % of the polyhedral silsesquioxane salt. In one embodiment, the composition comprises from about 0.5 wt. % to about 1.5 wt. % of the polyhedral silsesquioxane salt. In one embodiment, the composition comprises from about 0.6 wt. % to about 0.85 wt. % of the polyhedral silsesquioxane salt. In one embodiment, the composition comprises from about 0.69 wt. % to about 0.83 wt. % of the polyhedral silsesquioxane salt, and in one embodiment, about 0.78 wt % of the polyhedral silsesquioxane salt.

In some of the examples herein, the concentrations of the ingredients of the composition, and of the composition used in the process, both in accordance with the present invention, are expressed in terms of "C". "C" is a concentration defined relative to the concentration of the ingredients of the standard cleaning composition, SC-1, The value of "C" for each ingredient is different. For this purpose, the concentrations "C" for each of the ingredients in SC-1 are obtained with respect to an SC-1 composition prepared by combining 1.0 g of 29 wt. % ammonium hydroxide solution, 1.5 g of 30 wt. % hydrogen peroxide solution, and 50 g of water. To this formulation of SC-1, the appropriate content of the onium salt of a polyhedral silsesquioxane may be added to obtain the basic composition of the present invention. Based on the foregoing, for use herein, the values of "C" for each of the ingredients are obtained. Thus, as used herein, the value of "C" for ammonium hydroxide is 0.56 wt %; the value of "C" for hydrogen peroxide is 0.86 wt %; the value of "C" for the tetramethyl ammonium polyhedral silsesquioxane is 4.64 wt %. Thus, for example, in one embodiment, the concentration of the tetramethyl ammonium polyhedral silsesquioxane is about 0.17 C, and this corresponds to a content of 0.78 wt % of the tetramethyl ammonium polyhedral silsesquioxane. For chemical components other than the polyhedral silsesquioxanes and the standard components of SC-1, the value of "C" may be calculated as:

$$C_{component} = 0.032616 \times \text{molecular weight (MW) of the component.}$$

In one embodiment, the oxidizing agent is or comprises hydrogen peroxide. In other embodiments, the oxidizing agent is or comprises a non-metal hypochlorite salt, such as ammonium hypochlorite or a quaternary ammonium or quaternary phosphonium hypochlorite, such as tetramethylammonium hypochlorite. In one embodiment, the oxidizing agent is or comprises one or more of a quaternary ammonium or phosphonium periodate, such as tetramethylammonium periodate, or ozone. The foregoing quaternary ammonium or phosphonium oxidizers may comprise any of the alkyl or alkoxy groups defined herein for any of the other quaternary ammonium or phosphonium compounds. Combinations of any of the foregoing oxidizing agents may also be employed advantageously.

In one embodiment, the composition comprises from about 0.01 wt. % to about 10 wt. % of the oxidizing agent. In one embodiment, the composition comprises from about 0.05 wt. % to about 5 wt. % of the oxidizing agent. In one embodiment, the composition comprises from about 0.2 wt. % to about 2 wt. % of the oxidizing agent. In one embodiment, the composition comprises from about 0.1 wt. % to about 1 wt. % of the oxidizing agent. The oxidizing agent may be added as a solution, such as commercially available hydrogen peroxide which is available as 30% by weight $H_2O_2$, and suitable quantities of such commercially available preparations may be used to attain the desired concentrations.

In one embodiment, the metal ion-free base comprises ammonia, ammonium hydroxide, an onium hydroxide or any combination of two or more thereof. In one embodiment, the onium hydroxide has a general formula (III):

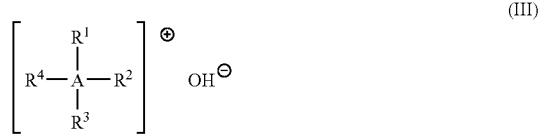

(III)

wherein in (III), each of $R^1$, $R^2$, $R^3$ and $R^4$ is independently H, an alkyl, alkoxy or alkanol group including $C_1$-$C_{18}$, and A=N or P. In one embodiment, A=N and each of $R^1$, $R^2$, $R^3$ and $R^4$ are alkyl, and the base is a tetraalkylammonium hydroxide. In one embodiment, A=P and each of $R^1$, $R^2$, $R^3$ and $R^4$ are alkyl, and the base is a tetraalkylphosphonium hydroxide. In one embodiment, each alkyl is methyl, and in one embodiment, each alkyl is ethyl.

Bases which are free of metal ions and suitable for use in the present invention include any one or more of the following. In one embodiment, as indicated above, the bases are quaternary ammonium hydroxides, such as tetraalkyl ammonium hydroxides (including hydroxy- and alkoxy-containing alkyl groups generally of from 1 to 4, but as high as 18, carbon atoms in the alkyl or alkoxy group) or the corresponding tetraalkyl phosphonium compounds. In one embodiment, the bases comprise one or more of tetramethyl ammonium hydroxide and trimethyl-2-hydroxyethyl ammonium hydroxide (choline). Examples of other usable quaternary ammonium hydroxides include: trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl)ammonium hydroxide, monomethyltri(2-hydroxyethyl)ammonium hydroxide, tetraethyl ammonium hydroxide, tetrapropyl ammonium hydroxide, tetrabutyl ammonium hydroxide, monomethyltriethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, and the like and mixtures thereof. As noted above, in one embodiment, the base comprises a phosphonium compound corresponding to any of the foregoing ammonium compounds, and in one embodiment, the base may comprise a mixture of any of the foregoing ammonium compounds with any of the foregoing phosphonium compounds.

In other embodiments, the base may include one or more of ammonium hydroxide, organic amines particularly alkanolamines such as 2-aminoethanol, 1-amino-2-propanol, 1-amino-3-propanol, 2-(2-aminoethoxy)ethanol, 2-(2-aminoethylamino)ethanol, 2-(2-aminoethylamino)ethylamine and the like, and other strong organic bases such as guanidine, 1,3-pentanediamine, 4-aminomethyl-1,8-octanediamine, aminoethylpiperazine, 4-(3-aminopropyl)morpholine, 1,2-diaminocyclohexane, tris(2-aminoethyl)amine, 2-methyl-1,5-pentanediamine and hydroxylamine. As noted above, in one embodiment, the base comprises a phosphonium compound corresponding to any of the foregoing ammonium compounds.

Alkaline solutions containing metal ions such as sodium or potassium should not be used because of the residual metal contamination that could occur which is detrimental to substrates such as semiconductor materials.

In one embodiment, the base is present at a concentration in the range from about 0.01 wt. % to about 25 wt. % based on tetramethylammonium hydroxide. In one embodiment, the base is present at a concentration in the range from about 0.1 wt. % to about 10 wt. % based on tetramethylammonium hydroxide. In one embodiment, the base is present at a concentration in the range from about 1 wt. % to about 5 wt. % based on tetramethylammonium hydroxide. In one embodiment, the base is added as a quaternary ammonium or phosphonium hydroxide at a sufficient concentration to maintain the pH of the composition in the range from pH 10 to pH 13.

In one embodiment, the base is present at a concentration in the range from about 0.01 wt. % to about 10 wt. % based on ammonia. In one embodiment, the base is present at a concentration in the range from about 0.1 wt. % to about 7 wt. % based on ammonia. In one embodiment, the base is present at a concentration in the range from about 1 wt. % to about 5 wt. % based on ammonia. In one embodiment, the base is added as ammonium or phosphonium hydroxide at a sufficient concentration to maintain the pH of the composition in the range from pH 10 to pH 13.

In one embodiment, a mixtures of any one or more of the additional alkaline components, particularly ammonium hydroxide, with the aforementioned tetraalkyl ammonium hydroxides is used. In one embodiment, the metal ion-free base is a mixture of ammonium hydroxide (i.e., ammonia dissolved in water) and tetramethylammonium hydroxide.

In one embodiment, the composition further comprises a metal chelating agent. Suitable metal chelating agents are disclosed below.

In one embodiment, the composition further comprises a surfactant. Suitable surfactants are disclosed below.

In one embodiment, the composition further comprises a water-miscible organic solvent. Suitable organic solvents are disclosed below.

Zeta Potential

Zeta potential is the electrical potential that exists at the shear plane of a particle, which is some small distance from the surface.

Particles, such as particles (including nano particles) formed during etching and other semiconductor processing steps, when subjected to a cleaning or rinsing solution, can be considered to be colloidal particles, dispersed in the cleaning or rinsing solution. Colloidal particles dispersed in a solution are electrically charged due to their ionic characteristics and dipolar attributes. Each colloidal particle dispersed in a solution is surrounded by oppositely charged ions called the fixed or Stern layer. Outside the Stern layer, there are varying compositions of ions of opposite polarities, forming a cloud-like area. This area is called the diffuse layer, and the whole area is electrically neutral.

Thus an electrical double layer is formed on the substrate surface in the region of the particle-liquid interface. This double layer may be considered to consist of two parts: the inner Stern layer region which includes ions bound relatively strongly to the substrate surface and the outer, diffuse layer or region in which the ion distribution is determined by a balance of electrostatic forces and random thermal motion. The potential in this outer, diffuse region, therefore, decays with the distance from the surface, until at a certain distance it becomes zero.

Zeta potential is a function of the surface charge of a particle, any adsorbed layer at the interface and the nature and composition of the surrounding medium in which the particle is suspended. Zeta potential can be calculated with the following Smoluchowski's formula:

$$\zeta = \frac{4\pi\eta}{\varepsilon} \times U \times 300 \times 300 \times 1000 \quad \begin{vmatrix} \zeta = \text{Zeta Potential (mV)} \\ \eta = \text{Viscosity of Solution} \\ \varepsilon = \text{Dielectric Constant} \\ U = \frac{v}{V/L} \text{:Electrophoretic Mobility} \\ v = \text{Speed of Particle (cm/sec)} \\ V = \text{Voltage (V)} \\ L = \text{The distance of Electorode} \end{vmatrix}$$

Most materials when immersed in water exhibit a zeta potential. Most particles have a negative surface charge.

In general, different forces dominate in particle removal, depending on the particle size. Regarding particle removal from a given surface, the adhesion force must be overcome by a combination of zeta force and flow drag force, i.e., the physical force applied to the particle by movement of the solution against the surface. Where the particle size is about 100 nm or greater, flow drag force is dominant in removal of particles from a given surface. Where the particle size is about 30 nm or less, the zeta force is dominant in removal of particles from a given surface. Where the particle size is between about 30 nm and about 100 nm, both the zeta force and the flow drag force are important, and may both be present. In general, the higher the zeta potential, i.e., the larger the negative value of the zeta potential, the higher the zeta force, and the better the removal of the particles. The highest possible zeta potential is most desirable, i.e., the largest negative values of zeta potential are most desirable.

As dimension sizes in the semiconductor industry continue to be reduced, the size of particles remaining on the semiconductor surfaces also becomes more critical. That is, for small dimensions, smaller particles can be a problem, whereas in larger dimensions, the same particles might not have presented such a problem. Thus, for example, while in 2005, at the 100 nm critical dimension level, the size limit for particles was 50 nm in FEOL (front end of line) and 100 nm in BEOL (back end of line), in 2008, at the 70 nm critical dimension level, the size limit for particles was 35 nm in FEOL and 70 nm in BEOL. By 2014, at the 35 nm critical dimension level, the size limit for particles will be 18 nm in FEOL and 36 nm in BEOL. Thus, it is becoming more important to remove smaller and smaller particles effectively. The present invention provides compositions and processes which can effectively remove such small particles.

The present inventor has discovered that, at the proper relative concentrations, a synergistic effect on the Zeta potential can be attained for removal of particles, and particularly nano particles, from the surfaces of integrated circuit or semiconductor devices by use of the composition of the present invention. The synergistic effect in the zeta potential between the onium salt of a polyhedral silsesquioxane and a base as observed for the present invention is illustrated in FIG. 1. Neither the pure onium salt of a polyhedral silsesquioxane nor the pure base show a higher zeta potential. However, an enhanced zeta potential (up to 1~3 times higher than the pure component) is observed for the mixture of the onium salt of a polyhedral silsesquioxane and base.

In one embodiment, particulate matter contaminating the surfaces of semiconductor devices and integrated circuit devices is a primary target of the composition and processes of the present invention. In one embodiment, the particulate matter comprises nanoparticles. In one embodiment, the particulate matter comprises a major portion of particles having a particle size in the range from about 0.1 nm to about 80 nm. In one embodiment, the particulate matter comprises a major portion of particles having a particle size in the range from about 0.5 nm to about 50 nm. In one embodiment, the particulate matter comprises a major portion of particles having a particle size in the range from about 0.5 nm to about 30 nm. In one embodiment, the particulate matter comprises a major portion of particles having a particle size in the range from about 1 nm to about 10 nm.

Preparation of Onium Salt of a Polyhedral Silsesquioxane

The onium salt of a polyhedral silsesquioxane used in the present invention may be prepared, for example, by the method outlined in U.S. Pat. No. 5,047,492, Example 8(a), by the reaction of, e.g., tetramethyl ammonium hydroxide with precipitated silicic acid. In order to obtain the desired onium salt of a polyhedral silsesquioxane, the ratio of the reactants should be at or very close to 1:1 on a molar basis and the reaction temperature should be about 60° C., and in one embodiment, the reaction temperature may be from about 50° C. to about 85° C. The reaction may be initiated at a lower temperature, but the elevated temperature is needed to obtain the desired polyhedral silsesquioxane anion.

The thus-prepared onium salt of a polyhedral silsesquioxane has a general formula $[M^+{}_n(Si_nO_{5n/2})^{n-}]$ (where n is an even integer from about 6 to about 20, although higher values of n may occur). In one embodiment, the formula is $[M^+{}_8Si_8O_{20}]^{8-}$ (where n=8), of which M represents a metal-free cation, which in one embodiment is tetramethylammonium. In one embodiment, the product comprises a polyhedral silsesquioxane having the structure (I) shown above. In one embodiment, the reaction product of the foregoing reaction includes primarily the formula $[M^+{}_n(Si_nO_{5n/2})^{n-}]$ in which n=8, but may also include onium salts of a polyhedral silsesquioxanes in which n=6 to n=about 20, in which n is an even-numbered integer, i.e., 6, 8, 10, 12, 14, 16, 18 or 20, and possibly higher values of n. Although not being bound by theory, it is theorized that odd values of n, e.g., 7, 9, 11, etc., are not formed, or if transiently formed, spontaneously rearrange into structures in which n is an even integer.

The onium salt of a polyhedral silsesquioxane of the present invention may also be prepared by reaction of quaternary ammonium hydroxides with TEOS or with fumed silica. In all cases, the molar ratio should be substantially 1:1 and the reaction carried out at the elevated temperatures disclosed above, in order to obtain the desired onium salt of a polyhedral silsesquioxane of the present invention.

The thus-prepared onium salt of a polyhedral silsesquioxane is different structurally from the silicates disclosed in patents U.S. Pat. No. 6,465,403 B1, U.S. Pat. No. 6,599,370 B2, U.S. Pat. No. 6,585,825 B1, EP 1,326,951 B1, US 2004/0220066 A1 and JP 10097082 A. The silicates used in these patents are commercially available silicates and are not considered to contain significant quantities of the polyhedral silsesquioxanes of the present invention. The molar ratio of the cation and $SiO_2$ in these silicates generally is not 1:1 on a molar basis, but instead is mostly about 0.5:1 on a molar basis (see Sigma-Aldrich tetramethylammonium silicate) and the chemical structure includes random oligomers. In contrast, the as-prepared onium salt of a polyhedral silsesquioxane disclosed herein has a cation and $SiO_2$ molar ratio of 1:1 moles with a polyhedral cage-like structure, as described herein.

EXAMPLE 1

Preparation of an Onium Salt of a Polyhedral Silsesquioxane of the Present Invention:

To 1 gallon of water in a suitable container is added 207.64 g of fumed silica and 1247.6 g of tetramethylammonium hydroxide (25.25% by weight). The mixture is stirred and heated slowly to a temperature of 60° C. The reaction is carried out at this temperature for 24 hours or until the mixture turns into a clear solution. The as-prepared solution contains an onium salt of a polyhedral silsesquioxane in aqueous solution and can be directly used for formulating a composition in accordance with the present invention.

EXAMPLE 2

Preparation of High Negative Zeta Potential Polyhedral Silsesquioxane Salt Formulations of the Present Invention An exemplary high negative zeta potential polyhedral silsesquioxane salt formulation is prepared By adding to a plastic vessel, the quantities specified in Table 1 of each of the above as-prepared polyhedral silsesquioxane salt solution, a mixture of ammonium hydroxide and tetramethylammonium hydroxide, hydrogen peroxide, and DI-water. The solutions are shaken to thoroughly mix and may be kept at room temperature overnight.

Table 1 shows these exemplary formulations for compositions in accordance with the present invention. Table 2 shows exemplary etching rates and pH values for the formulations of Table 1, In Table 2, the test particles are formed of silicon dioxide ($SiO_2$), silicon nitride ("SiN") or polystyrene latex particle ("PS").

TABLE 1

| | | Formulation | | | |
|---|---|---|---|---|---|
| 1 | TMA Silicate (14.41% wt) 5124.35 g | | $NH_3 H_2O$ (29% wt) 304.88 | $H_2O$ 150,000 g | $H_2O_2$ (30% wt) 4573.13 | |
| 2 | TMA Silicate (14.47% wt) 8684.07 g | | $NH_3 H_2O$ (29% wt) 519.82 g | $H_2O$ 150,000 g | $H_2O_2$ (30% wt) 4669.0 g | |
| 3 | TMA Silicate (14.47% wt) 7765.71 g | | $NH_3 H_2O$ (29% wt) 154.64 g | $H_2O$ 150,000 g | $H_2O_2$ (30% wt) 4639.2 g | |
| 4 | TMA Silicate (14.40% wt) 7162.68 g | | $NH_3 H_2O$ (29% wt) 1252.35 g | $H_2O$ 120,000 g | $H_2O_2$ (30% wt) 3757.04 g | |
| 5 | TMA Silicate (14.40% wt) 7216.91 g | | $NH_3 H_2O$ (29% wt) 2523.66 g | $H_2O$ 120,000 g | $H_2O_2$ (30% wt) 3785.49 g | |
| 6 | TMA Silicate (14.17% wt) 6209.7 g | | $NH_3 H_2O$ (29% wt) 4273.9 g | $H_2O$ 100,000 g | $H_2O_2$ (30% wt) 427.4 g | |
| 7 | TMA Silicate (14.17% wt) 6117.68 g | ethanol-amine 210.53 g | $NH_3 H_2O$ (29% wt) 2105.3 g | $H_2O$ 100,000 g | $H_2O_2$ (30% wt) 3157.9 g | NOVEC ® 4200 105.3 g |

TABLE 2

Exemplary performance of formulations

| Formulation | zeta potential (mv) | | | | etching rate (A/min) | | pH value |
|---|---|---|---|---|---|---|---|
| 1 | $SiO_2$ −82.5 | SiN −72.5 | PS −86.9 | $SiO_2$ 0 | Poly Si 0.23 | with $H_2O_2$ 10.59 | No $H_2O_2$ 12.164 |
| 2 | $SiO_2$ −82.5 | SiN −97.8 | PS −85.6 | $SiO_2$ 0 | Poly Si 0.14 | with $H_2O_2$ 10.53 | No $H_2O_2$ 11.644 |
| 3 | $SiO_2$ −83.2 | SiN −85.4 | PS −80.5 | $SiO_2$ 0 | Poly Si 0.08 | with $H_2O_2$ 10.49 | No $H_2O_2$ 11.621 |
| 4 | $SiO_2$ −89.1 | SiN −102 | PS −107 | $SiO_2$ 0 | Poly Si 0.17 | with H2O2 10.967 | No H2O2 12.052 |
| 5 | $SiO_2$ −87.2 | SiN −105 | PS −108 | $SiO_2$ 0 | Poly Si 0.09 | with H2O2 11.037 | No H2O2 12.119 |
| 6 | $SiO_2$ −90.2 | SiN −96 | PS −98.4 | $SiO_2$ 0.051 | Poly Si 1.61 | with H2O2 11.544 | No H2O2 11.69 |

TABLE 2-continued

Exemplary performance of formulations

| Formu-lation | zeta potential (mv) | | | | etching rate (A/min) | | pH value | |
|---|---|---|---|---|---|---|---|---|
| | $SiO_2$ | SiN | PS | $SiO_2$ | Poly Si | with $H_2O_2$ | No $H_2O_2$ | |
| 7 | −88.8 | −95.8 | −95.4 | 0 | 0.08 | 10.878 | 11.948 | |

EXAMPLE 3

Figure 5:
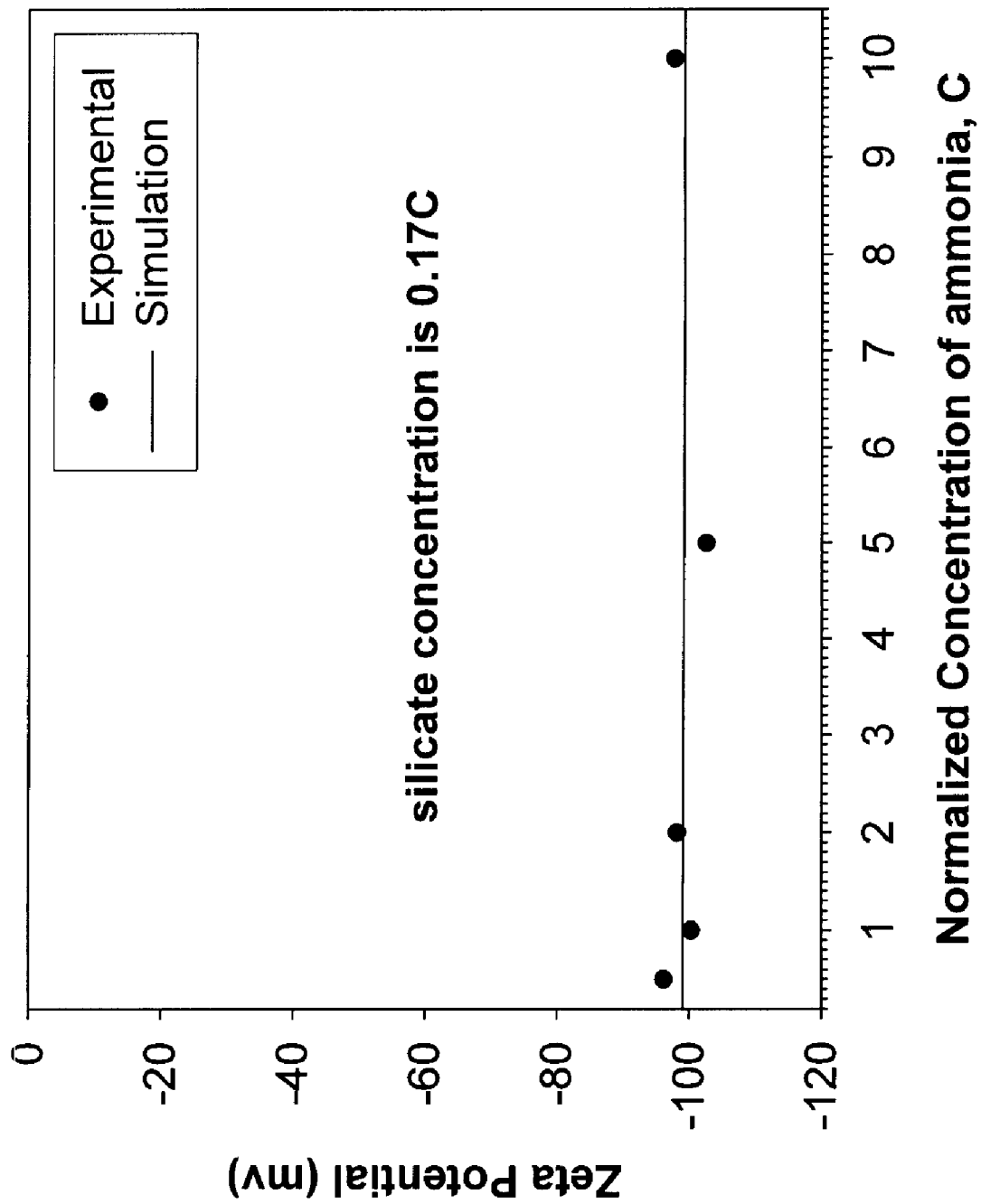
FIG. 5 is a graph illustrating the zeta potential for silicon nitride observed for embodiments of compositions in accordance with the present invention.

Formulations with High Negative Zeta Potential Independent of Base Concentration The following formulations are prepared and the results are shown in FIG. 5.

| | |
|---|---|
| polyhedral silsesquioxane: | 0.17C (C = 4.64 wt. % for silsesquioxane as above) |
| ammonium hydroxide | varied from 0.1C to 10C (C for $NH_4OH$) |
| hydrogen peroxide | varied from 0.1C to 10C (C for $H_2O_2$) | where C=concentration of each component of SC-1 as defined herein. See FIG. 5 for the results and discussion thereof set forth below.

Additional Optional Components of the Composition

In one embodiment, the composition further comprises a chelating agent. The chelating agents may be added to increase the capacity of the composition to dissolve and retain metals in solution and to enhance the dissolution of metallic residues on the wafer substrate. Typical examples of chelating agents useful for this purpose are the following organic acids and their isomers and salts: (ethylenedinitrilo)tetraacetic acid (EDTA), butylenediaminetetraacetic acid, cyclohexane-1,2-diaminetetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine.

In one embodiment, the amount of chelating agent used is in the range from about 0.001 wt. % to about 10 wt. %. In another embodiment, the amount of organic solvent used is in the range from about 0.1 wt. % to about 1 wt. %.

In one embodiment, the composition further comprises a surfactant. Any suitable water-soluble amphoteric, non-ionic, cationic or anionic surfactant may be used.

In one embodiment, the surfactant includes a fluorinated anionic surfactant, such as 3M™ Novec™ 4200, which is an anionic fluorochemical surfactant in water, believed to be at a concentration of 25 wt %.

Amphoteric surfactants useful in the compositions of the present invention include betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof.

Non-ionic surfactants useful in the compositions of the present invention include acetylenic diols, ethoxylated acetylenic diols, fluorinated alkyl alkoxylates, fluorinated alkyl esters, fluorinated polyoxyethylene alkanols, aliphatic acid esters of polyhydric alcohols, polyoxyethylene monoalkyl ethers, polyoxyethylene diols, siloxane type surfactants, and alkylene glycol monoalkyl ethers.

Anionic surfactants useful in the compositions of the present invention include carboxylates, N-acylsarcosinates, sulfonates, sulfates, and mono and diesters of orthophosphoric acid such as decyl phosphate. Preferably, the anionic surfactants are metal-free surfactants.

Cationic surfactants useful in the compositions of the present invention include amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants.

In one embodiment, the amount of surfactant used is in the range from about 0.001 wt. % to about 5 wt. %. In another embodiment, the amount of surfactant used is in the range from about 0.01 wt. % to about 1 wt. %.

In one embodiment, the composition further comprises one or more water-miscible organic solvent. Among the various organic solvents suitable are alcohols, polyhydroxy alcohols. glycols, glycol ethers, alkyl-pyrrolidinones such as N-methylpyrrolidinone (NMP), 1-hydroxyalkyl-2-pyrrolidinones such as 1-(2-hydroxyethyl)-2-pyrrolidinone (HEP), dimethylformamide (DMF), dimethylacetamide (DMAc), sulfolane or dimethylsulfoxide (DMSO). In one embodiment, the water-miscible organic solvent is one or more polyhydroxy alcohol such as glycerol and/or 1-hydroxyalkyl-2-pyrrolidinones such as 1-(2-hydroxyethyl)-2-pyrrolidinone (HEP).

In one embodiment, the amount of organic solvent used is in the range from about 0.1 wt. % to about 20 wt. %. In another embodiment, the amount of organic solvent used is in the range from about 1 wt. % to about 10 wt. %.

In one embodiment, the composition of the present invention does not contain a major amount of organic solvent.

Processes

The present invention further relates to processes employing the above-described compositions. Thus, in one embodiment, the present invention relates to a process for removing particulate matter from a surface of an integrated circuit device, including applying to the surface any of the foregoing compositions. In one embodiment, the process for removing particulate matter from a surface of an integrated circuit device during fabrication thereof, includes:

applying to the surface a composition comprising:
(a) one or more metal ion-free base;
(b) a water-soluble metal ion-free salt of a polyhedral silsesquioxane;
(c) an oxidizing agent; and
(d) metal ion-free water; and
rinsing the surface with metal ion-free water. Additional process steps may be included, of course, such as further rinses, drying, etc., as will be understood by those of skill in the art. The salt of a polyhedral silsesquioxane may be any of those disclosed herein, the description of which is not repeated here for brevity.

In one embodiment, when used to remove particulate matter from the surface of a semiconductor or integrated circuit device, the composition exhibits a zeta potential for nanoparticles adhered to the integrated circuit device substantially lower (i.e., more negative) than a zeta potential of a composition comprising a prior art tetraalkyl ammonium silicate as substantially the only silicate. In one embodiment, the composition of the present invention, when applied according to the method of the present invention, provides a synergistically enhanced zeta potential, when compared to compositions using commercially available prior art silicates, such as the tetramethyl ammonium silicate available from Sigma/Aldrich. In one embodiment, the molar ratio of tetramethyl ammonium base to silicon dioxide used in preparation of the polyhedral silsesquioxane salt of the present invention is substantially 1:1, as compared to the approximately 0.5:1 ratio of base to silicate in commercially available silicates. As the present inventor has discovered, when the onium salt of a polyhedral silsesquioxane of the present invention is used in the composition in accordance with the present invention, a synergistic increase in negative zeta potential is observed for removal of particulate matter from surfaces of integrated circuit devices. In one embodiment, the synergistic increase in negative zeta potential is observed for the removal of nano particles from the surfaces of the integrated circuit device. In one embodiment, in addition to the synergistic increase in negative zeta potential, the composition used in the process of the present invention provides this improvement while causing substantially no etching of dielectric materials. Such dielectric materials may include, for example, one or more of silicon dioxide, doped silicon dioxide, silicon nitride, high-K dielectric materials, and low-K dielectric materials.

Thus, in one embodiment, the integrated circuit includes at least one dielectric material and the composition exhibits substantially no etching of the dielectric material. Substantially no etching means that less than about 0.5 Å per minute of exposure is observed.

In addition, the composition of the present invention causes very little or no etching of silicon materials, such as polysilicon, silicon-germanium, doped silicon, or doped silicon-germanium. Thus, when the integrated circuit device includes at least one silicon material and the composition exhibits substantially no etching of the silicon material.

In addition, the composition of the present invention causes very little or no etching of metals, such as aluminum, copper, tungsten, or other metals commonly used in integrated circuit devices. Thus, when the integrated circuit device includes at least one metal and the composition exhibits substantially no etching of the metal.

FIG. 1 is a graph illustrating the synergistic increase in negative zeta potential observed for an embodiment of a composition in accordance with the present invention. In FIG. 1, the salt content is the content of the polyhedral silsesquioxane in a composition in accordance with an embodiment of the present invention. As shown in FIG. 1, as the mol % of the salt content increases from about 10 mol % to about 80 mol %, in this range a synergistic increase in the negative zeta potential is observed. Although not shown in FIG. 1, a composition containing prior art quaternary ammonium silicate and base does not obtain such a large increase in the negative zeta potential. Rather, tests show that as the relative salt content increases, the zeta potential remains at about −40 mv, yielding a substantially horizontal line when applied to the graph shown in FIG. 1. This is a clear demonstration of the synergism obtained by the composition of the present invention, which is not observed with prior art silicate compositions.

Figure 2:
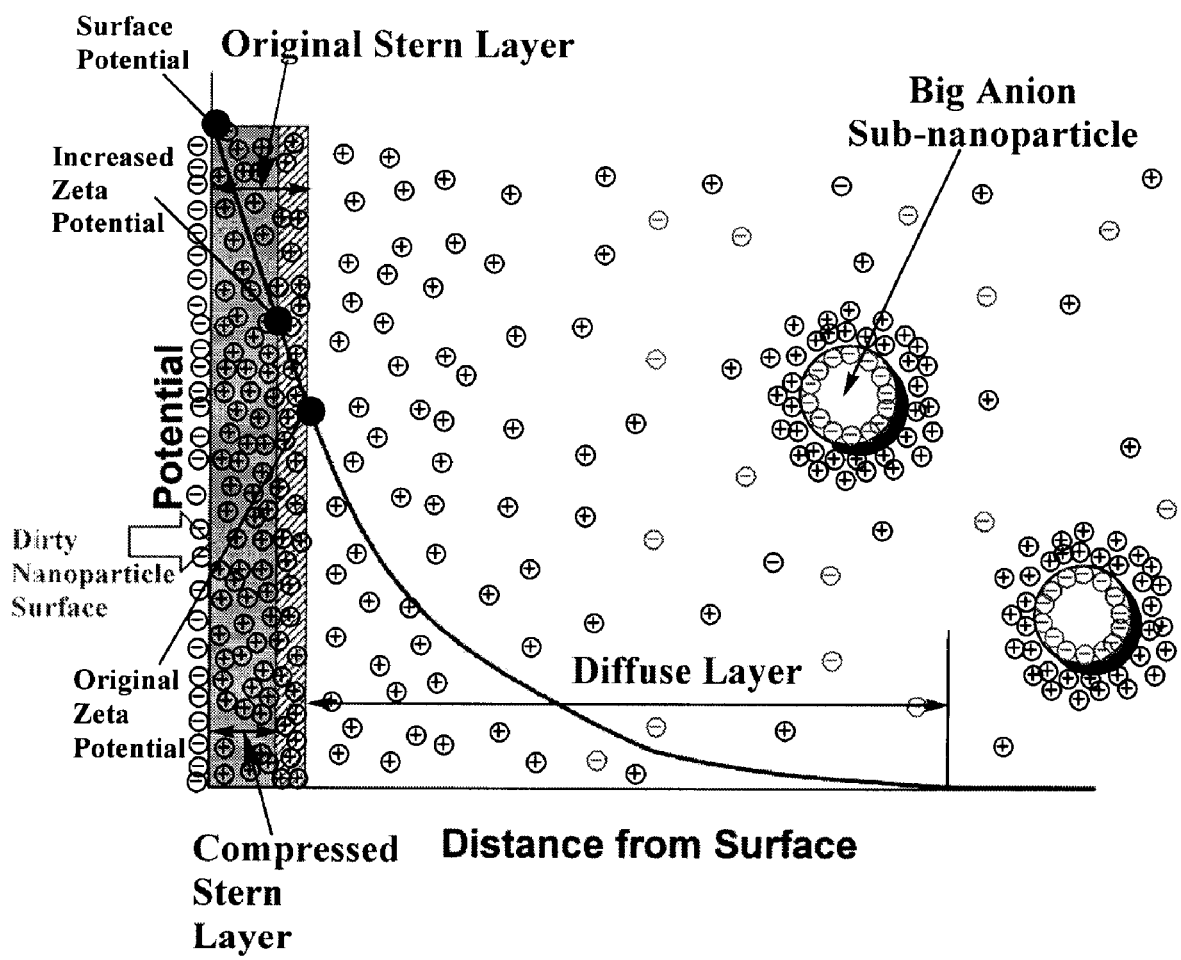
FIG. 2 is a schematic depiction of the reduction in the thickness of the Stern layer and increased negative zeta potential observed for an embodiment of a composition in accordance with the present invention.

FIG. 2 is a schematic depiction of the reduction in the thickness of the Stern layer and increased negative zeta potential observed for an embodiment of a composition in accordance with the present invention. As shown in FIG. 2, prior to application of a composition in accordance with an embodiment of the present invention, an original Stern layer, having a given thickness, is present at the surface potential plane of a hypothetical "dirty nano particle". The "big anions" in FIG. 2 represent the polyhedral silsesquioxane-containing composition of the present invention. As a result of the presence of the big anions, which interfere with the positive charges in the Stern layer, the Stern layer is reduced in thickness, forming the compressed Stern layer shown in FIG. 2. As also shown in FIG. 2, the zeta potential is increased from the original to an increased zeta potential as a result of the reduction of the Stern layer.

Figure 3:
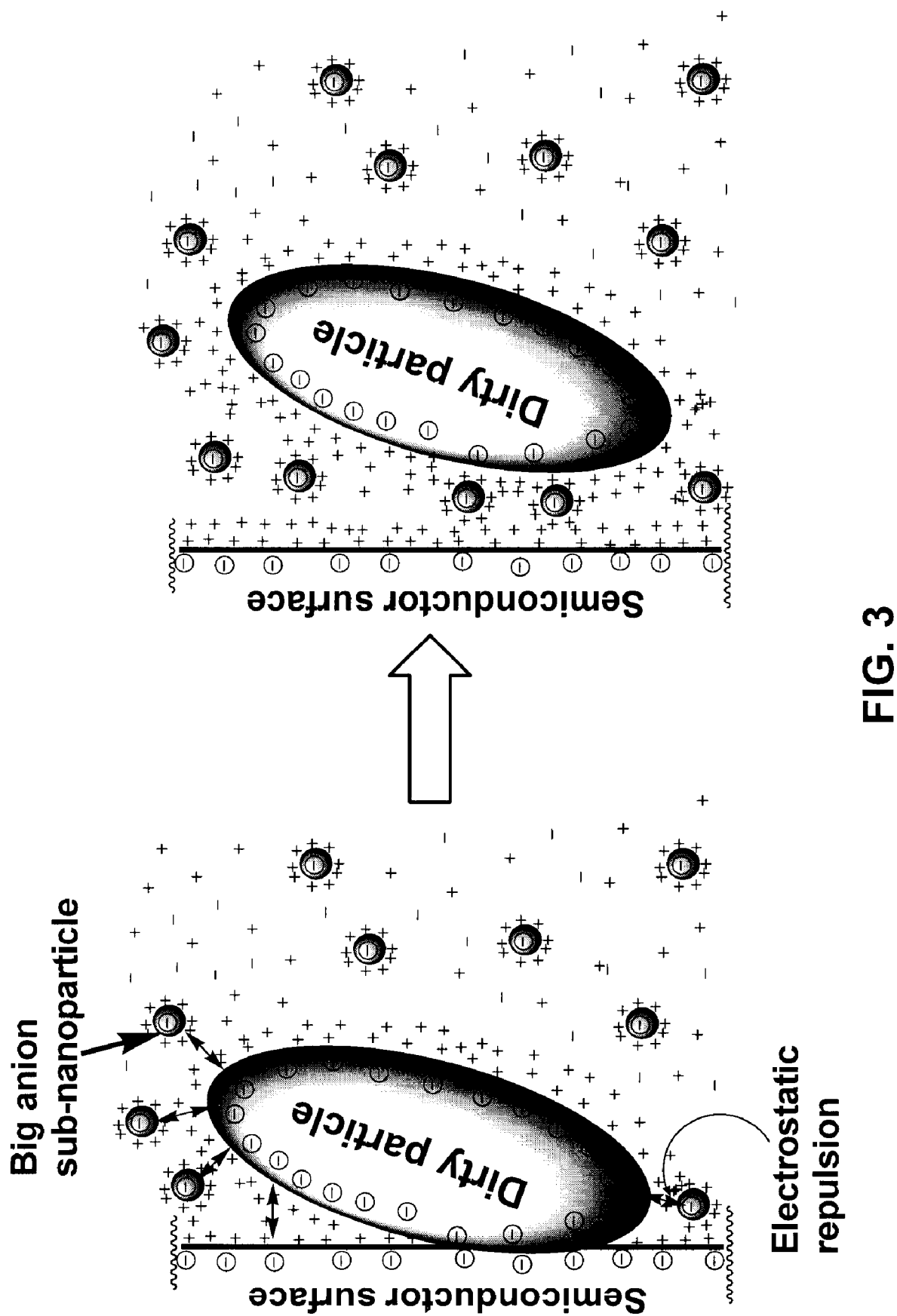
FIG. 3 is a schematic depiction of a hypothetical dirty particle adhering to and being removed from the surface of a semiconductor device for an embodiment of a composition in accordance with the present invention.

FIG. 3 is a schematic depiction of a hypothetical dirty particle adhering to and being removed from the surface of a semiconductor device for an embodiment of a composition in accordance with the present invention. As shown in FIG. 3, a hypothetical "dirty particle" is initially adhered to the semiconductor surface, and includes a double layer of charges surrounding the surface of the particle. The "large anions" in FIG. 3 represent the polyhedral silsesquioxane-containing composition of the present invention.

As a result of the presence of the large anions, which interfere with the positive charges in the double layer, the double layer is disrupted and the "dirty particle" is more easily moved away from the surface of the semiconductor.

Figure 4:
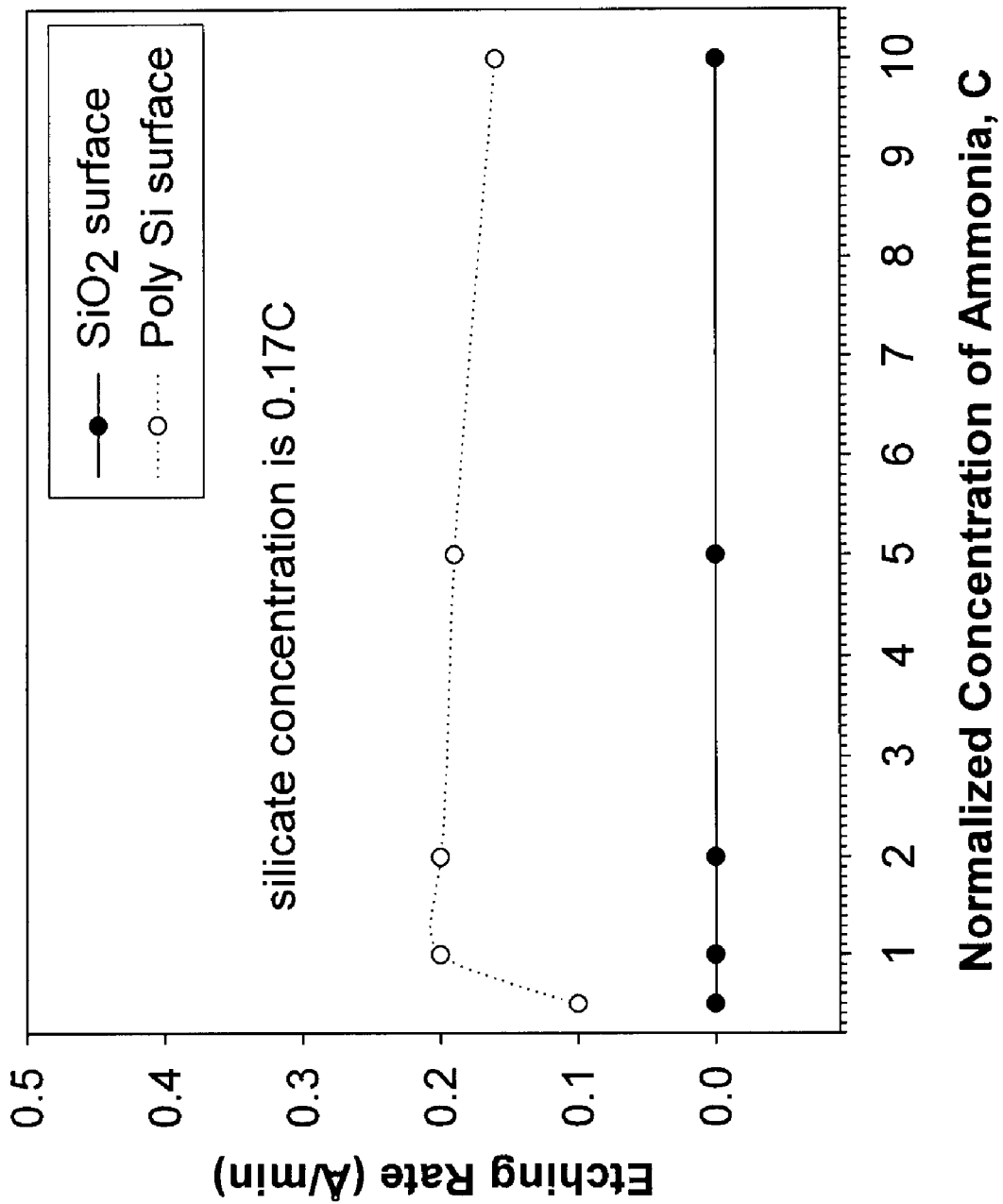
FIG. 4 is a graph illustrating the etching rates for silicon and silicon dioxide observed for embodiments of compositions in accordance with the present invention.

FIG. 4 is a graph illustrating the etching rates for silicon and silicon dioxide observed for embodiments of compositions in accordance with the present invention. FIG. 4 shows that for fixed polyhedral silsesquioxane content, there are no substantial changes observed in poly-Si or $SiO_2$ loss from etching, even with large changes in the added $NH_3$ content. The "C" multiplier in FIG. 4 is approximately 0.55 wt. % of $NH_3$, which is the content of $NH_3$ in a standard SC-1 reference solution. The fixed polyhedral silsesquioxane content is 0.17 C or ~0.09 wt. %. This graph indicates that a composition in accordance with an embodiment of the present invention can achieve a damage-free cleaning of semiconductor substrates containing ubiquitous materials such as poly-Si and $SiO_2$.

FIG. 5 is a graph illustrating the zeta potential for silicon nitride observed for embodiments of compositions in accordance with the present invention, and relates to Example 3 above. FIG. 5 shows that for fixed polyhedral silsesquioxane salt content, again at 0.17 C as described for FIG. 4, no substantial changes are observed in the zeta-potential, even with large changes in both the $NH_3$ and hydrogen peroxide contents. In the embodiment illustrated in FIG. 5, the value of 0.17 C for the onium salt of a polyhedral silsesquioxane is in an optimum range for the content of polyhedral silsesquioxane and the content of $NH_3$ and hydrogen peroxide are varied to find a minimum zeta potential value (i.e., a maximum negative zeta potential). Example 3 and FIG. 5 demonstrate that a composition in accordance with an embodiment of the present invention can achieve a high negative zeta potential.

In all of the FIGS. 6-20, the anion X is fluoride, Y is chloride, Z is bromide, and the cations A, B, C, D and E are, respectively, tetramethyl ammonium, tetraethyl ammonium, tetrapropyl ammonium, tetrabutyl ammonium and phenyltrimethyl ammonium.

Figure 6:
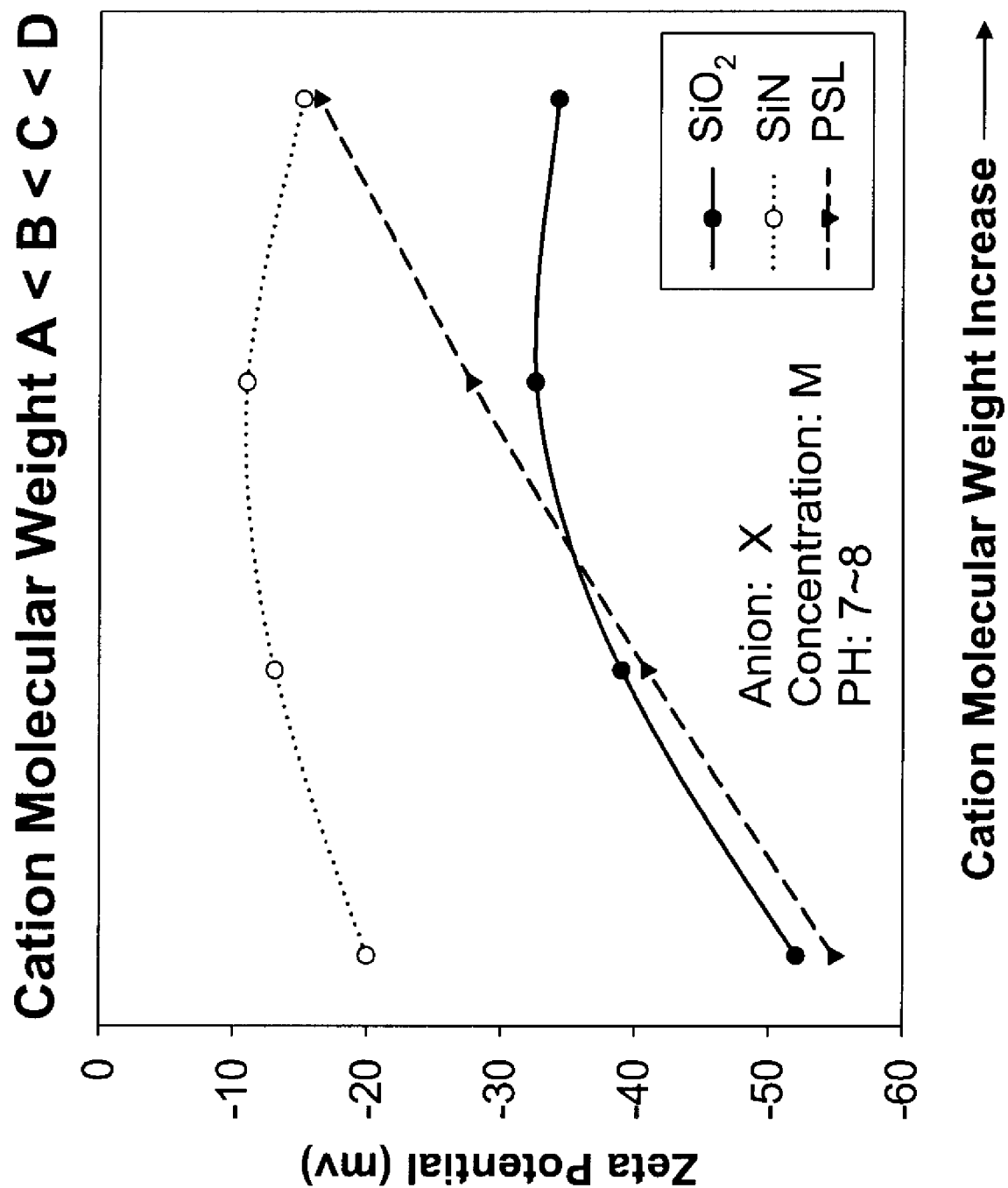
FIGS. 6-9 illustrate the influence of cation size on the zeta potential at different pH conditions and with different anion sizes for particles consisting of three different materials.
Figure 7:
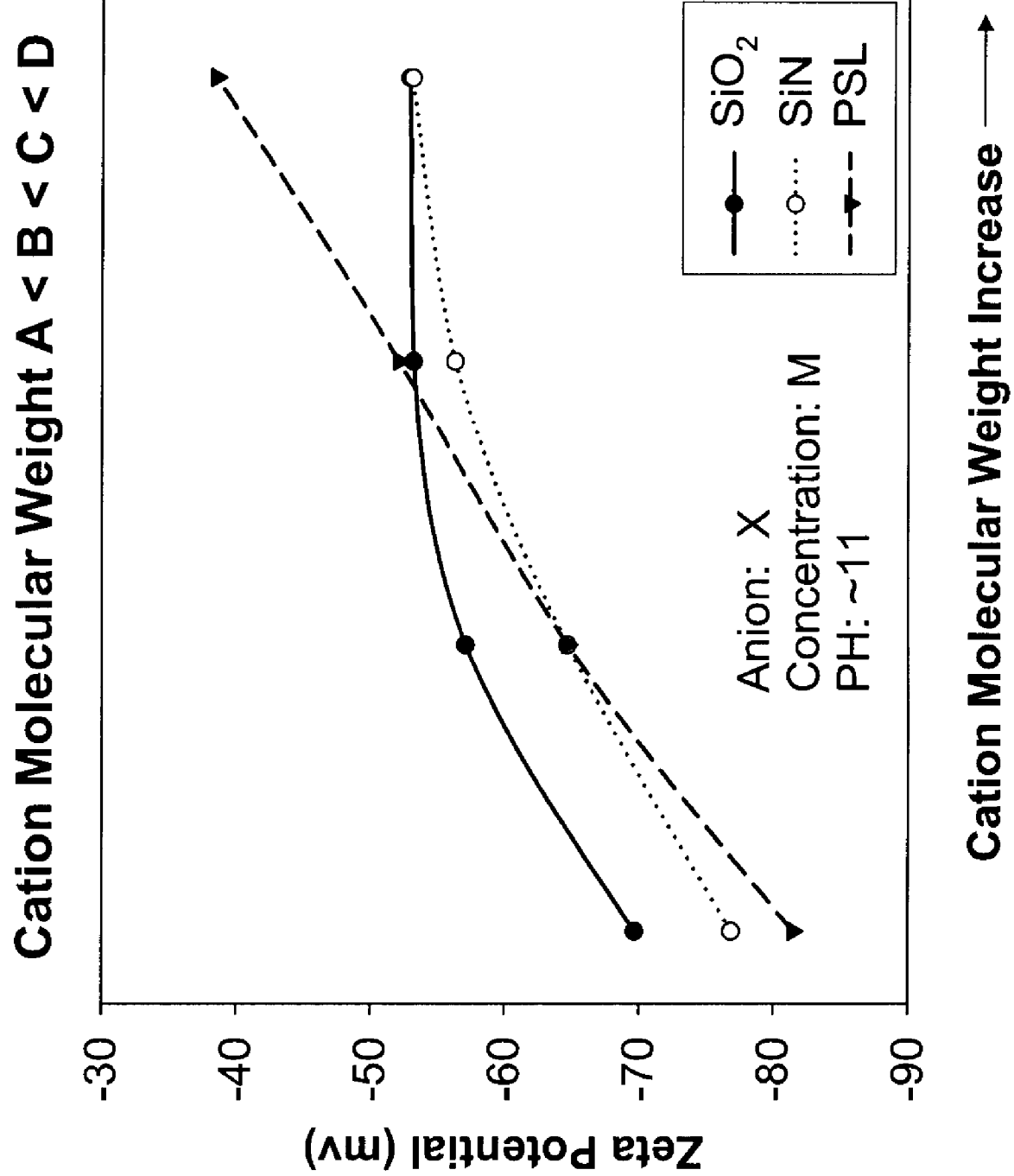
Figure 8:
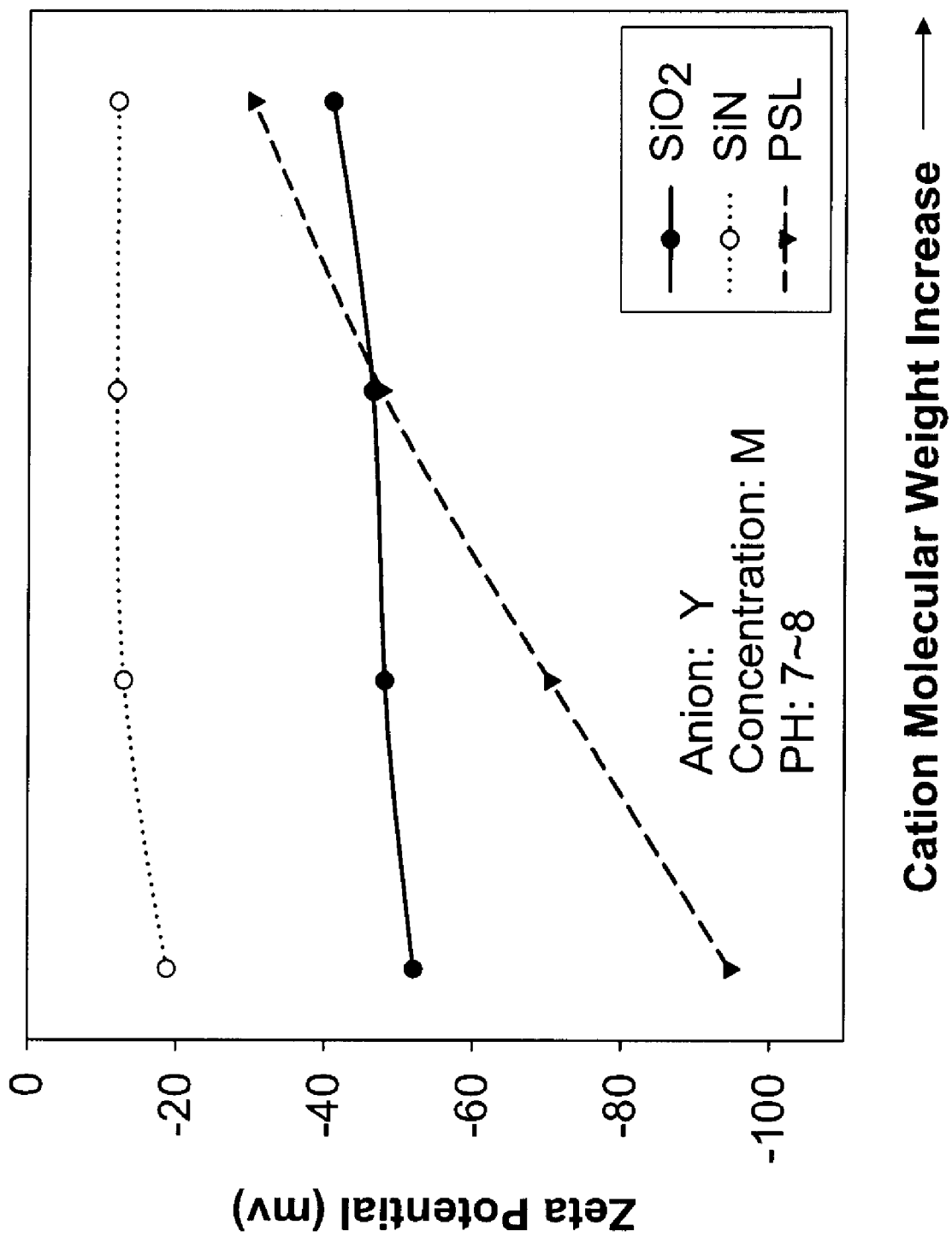
Figure 9:
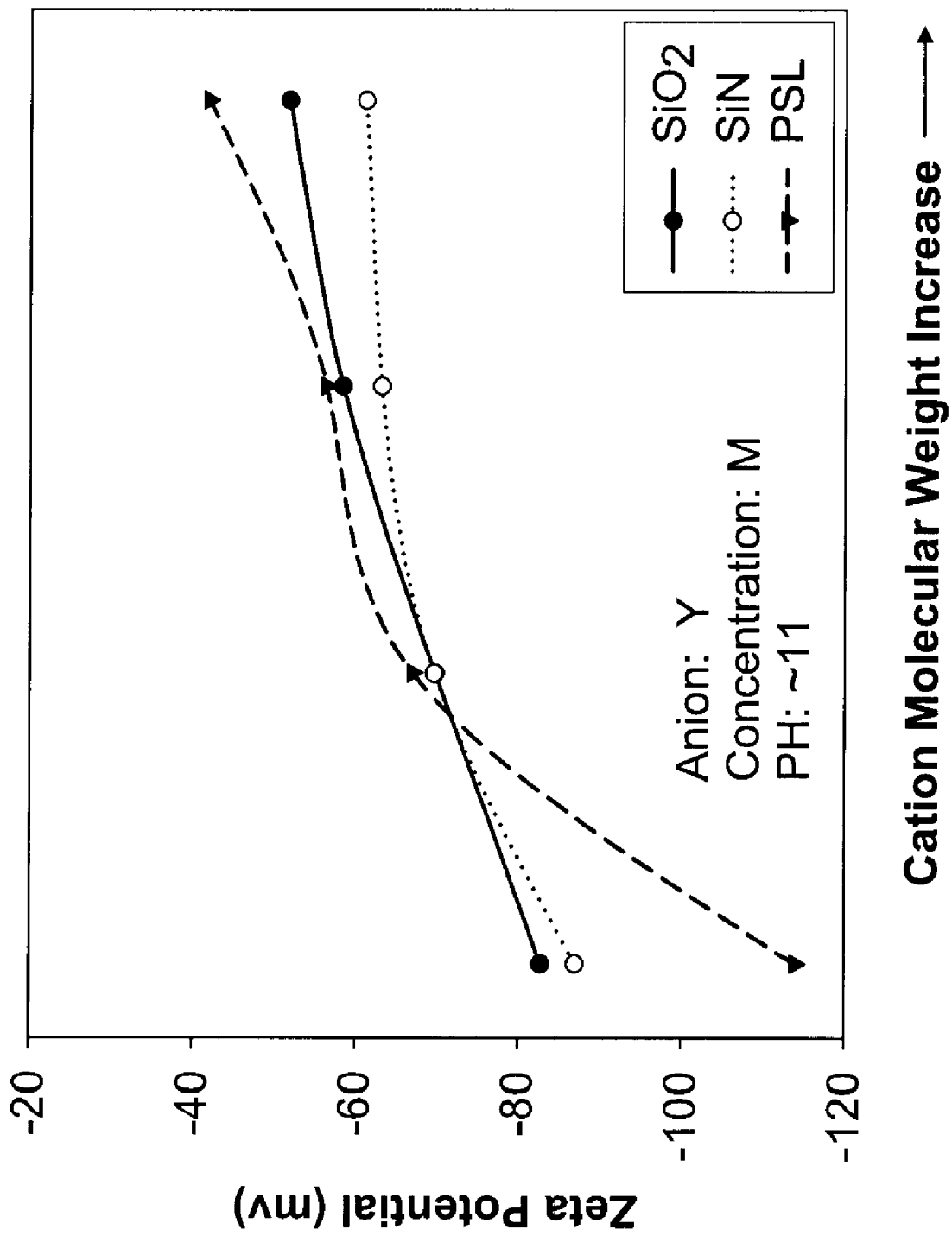

FIGS. 6-9 illustrate the influence of cation size on the zeta potential at different pH conditions and with different anion sizes for particles consisting of three different materials, at standard concentration M. FIG. 6 illustrates the effect at essentially neutral pH, about pH 7-8, As illustrated by FIG. 6, for all particles, with anion X and neutral pH, the minimum zeta potential is achieved with the smallest (lowest mw) cation. FIG. 7 illustrates the effect at high pH, about pH 11, As illustrated in FIG. 7, for all particles, with anion X and pH=11, the minimum zeta potential is achieved with the smallest (lowest mw) cation. This dependence holds for all particles at pH=11, In FIGS. 8 and 9, the anion Y is chloride, and the cations A, B, C and D are, respectively, tetramethyl ammonium, tetraethyl ammonium, tetrapropyl ammonium and tetrabutyl ammonium. FIG. 8 illustrates the effect at essentially neutral pH, about pH 7-8, As illustrated by FIG. 8, for all particles, with anion Y and pH=7-8, the minimum zeta potential is achieved with the smallest (lowest mw) cation. This dependence is very weak for the inorganic particles at pH=7-8, FIG. 9 illustrates the effect at high pH, about pH 11, As illustrated by FIG. 9, for all particles, with anion Y and pH=11, the minimum zeta potential is achieved with the smallest (lowest mw) cation. This dependence holds for all of the illustrated particles at pH=11.

Figure 10:
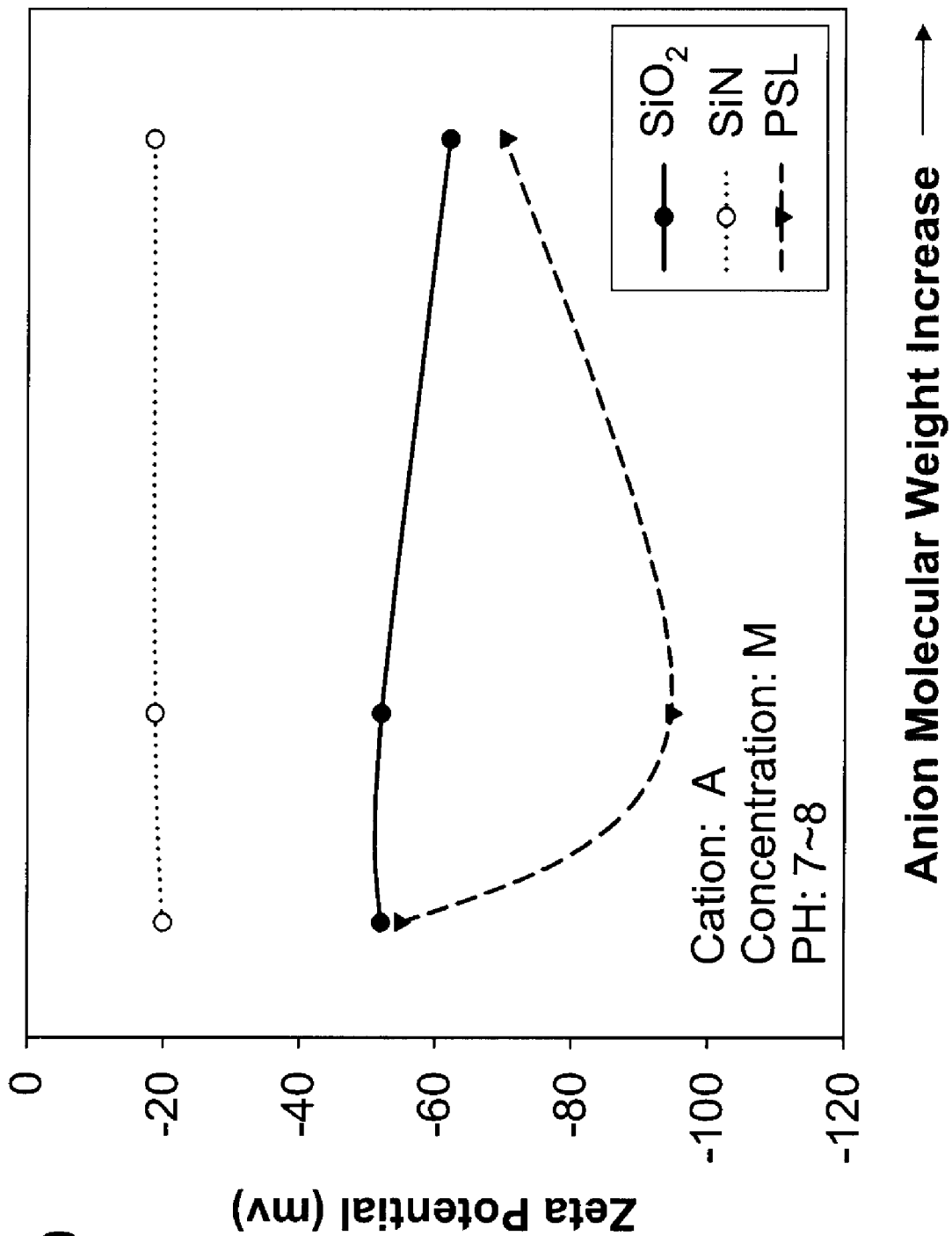
FIGS. 10-13 illustrate the influence of anion size on the zeta potential at different pH conditions and with different cation sizes for particles consisting of three different materials.
Figure 11:
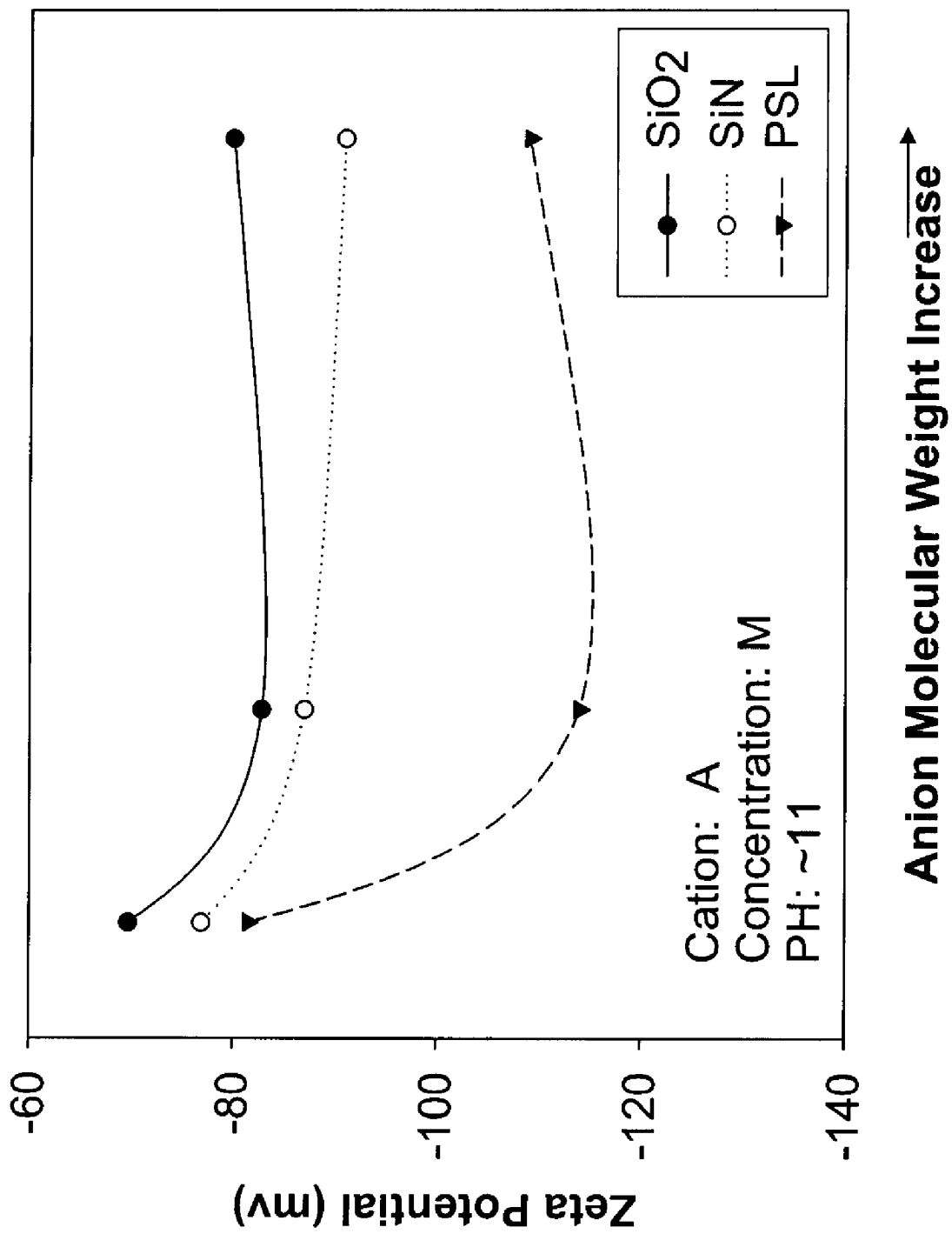
Figure 12:
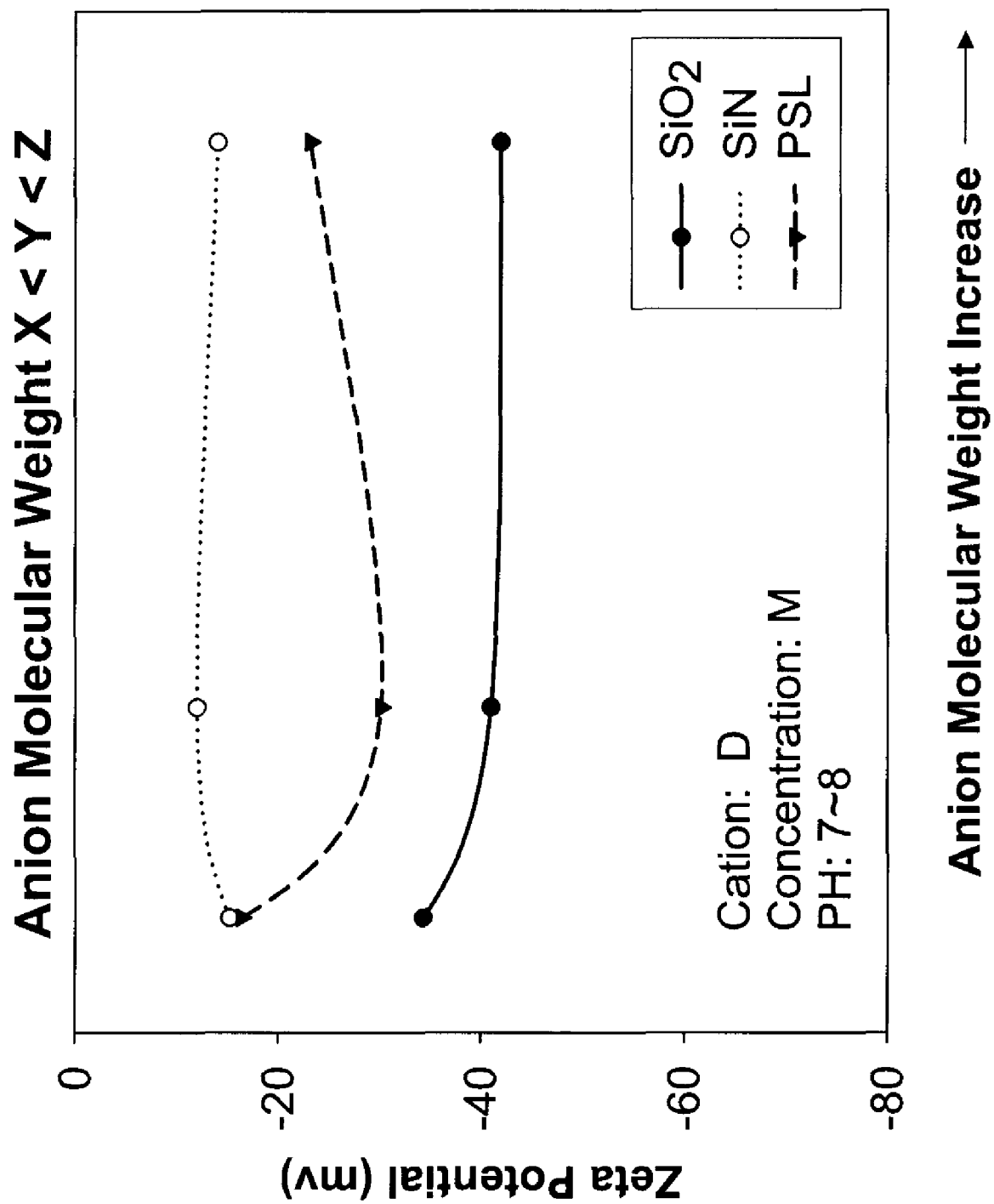
Figure 13:
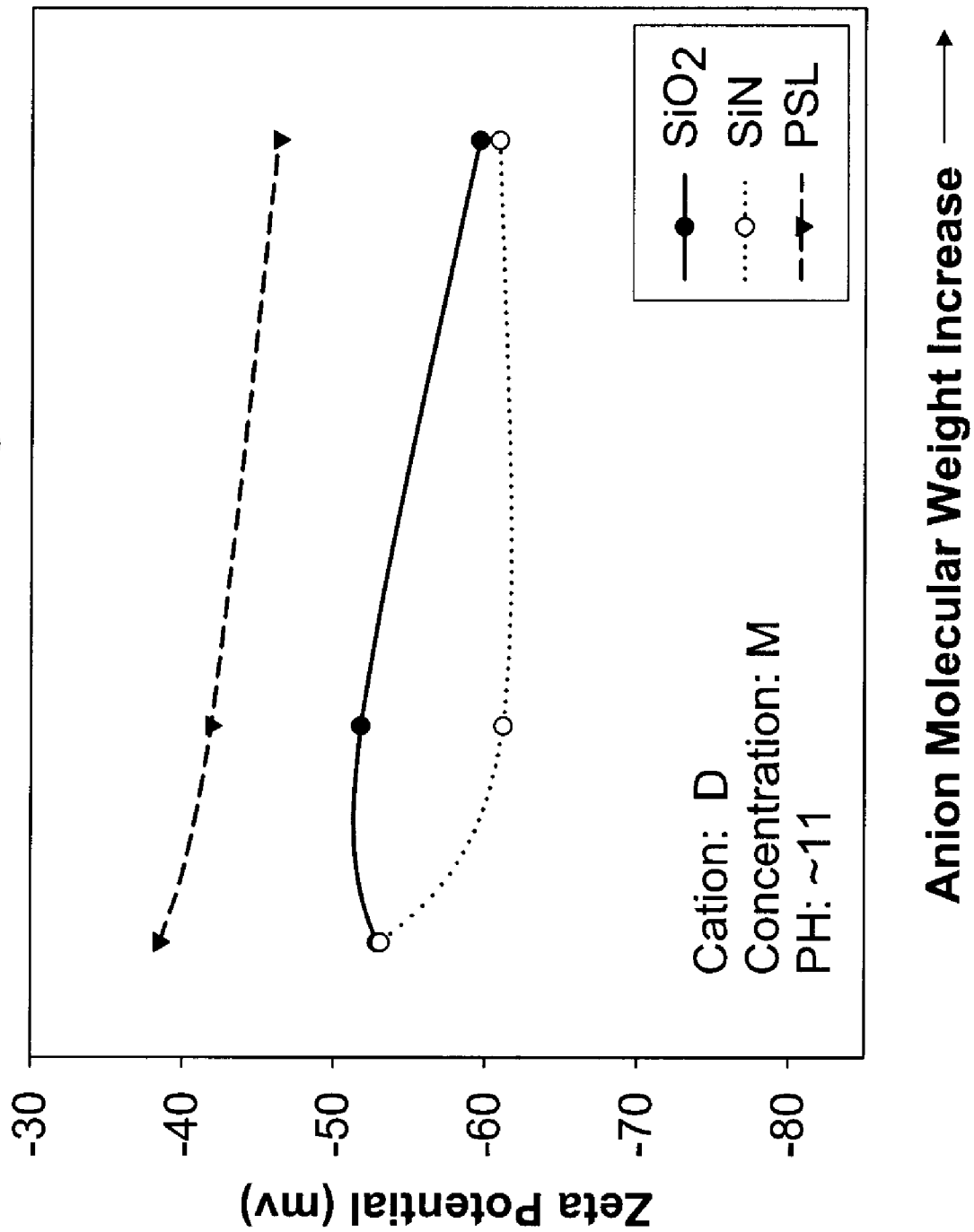

FIGS. 10-13 illustrate the influence of anion size on the zeta potential at different pH conditions and with different cation sizes for particles consisting of three different materials, at standard concentration M. In FIGS. 10 and 11, the cation A is tetramethyl ammonium, and the anions X, Y and Z are, respectively, fluoride ion, chloride ion and bromide ion. FIG. 10 illustrates the effect at essentially neutral pH, about pH 7-8, As illustrated in FIG. 10, for all particles, with cation A and pH=7-8, zeta potential is not correlated with anion MW. One (PSL) shows a reduction in zeta potential for 1 anion. FIG. 11 illustrates the effect at high pH, about pH 11, As illustrated in FIG. 11, for all particles, with cation A and pH=11, zeta potential is highest with a small anion. In FIGS. 12 and 13, the cation D is tetrabutyl ammonium, and the anions X, Y and Z are, respectively fluoride ion, chloride ion and bromide ion. FIG. 12 illustrates the effect at substantially neutral pH, about pH 7-8, As illustrated in FIG. 12, for all particles, with cation D and pH=7-8, zeta potential is relatively high and is not correlated with anion molecular weight. FIG. 13 illustrates the effect at high pH, about pH 11, As illustrated in FIG. 13, for all particles, with cation D and pH=11, zeta potential is lowest with highest anion molecular weight.

Figure 14:
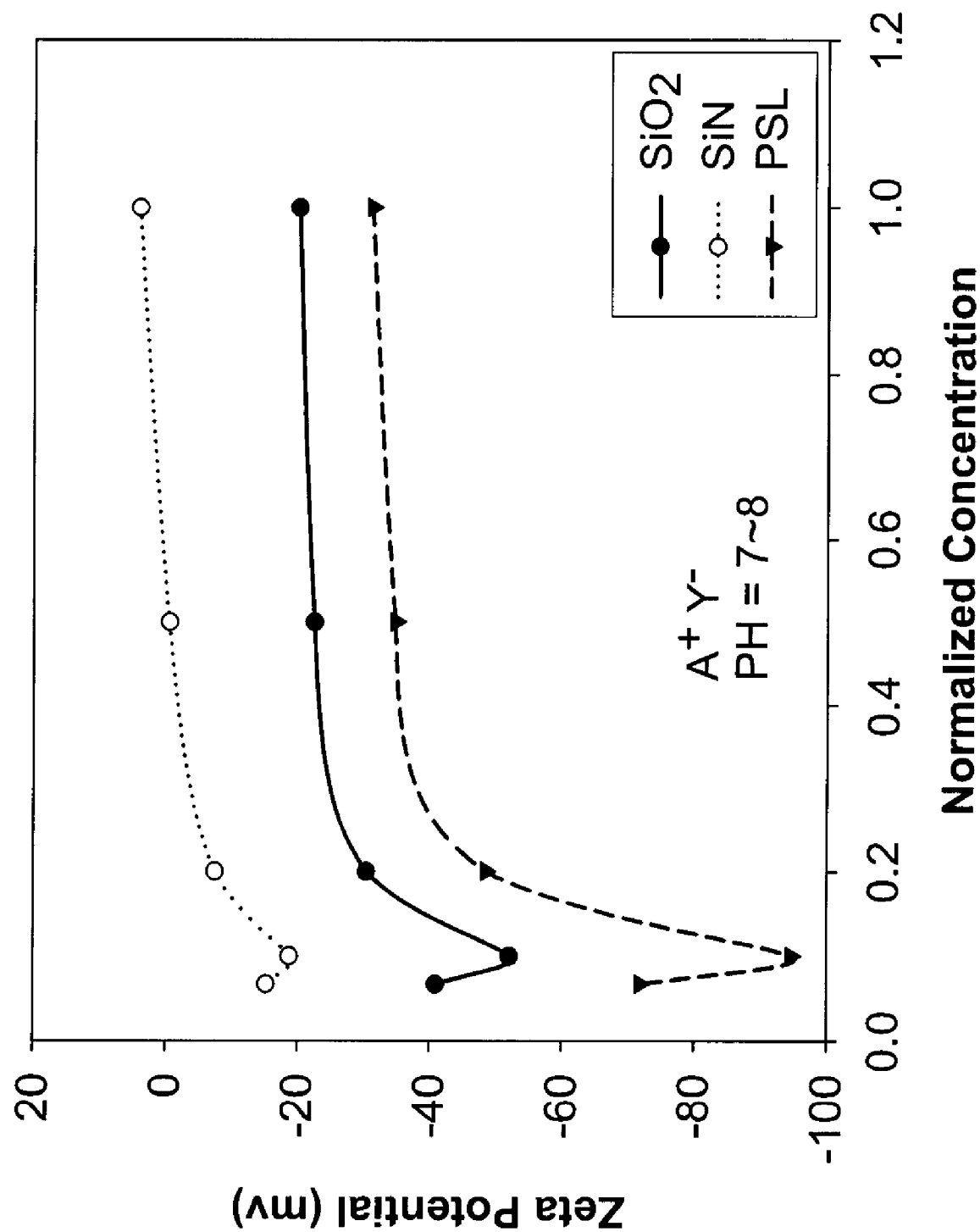
FIGS. 14-17 illustrate the concentration influence on zeta potential at different pH conditions and with different anion and cation sizes for particles consisting of three different materials.
Figure 15:
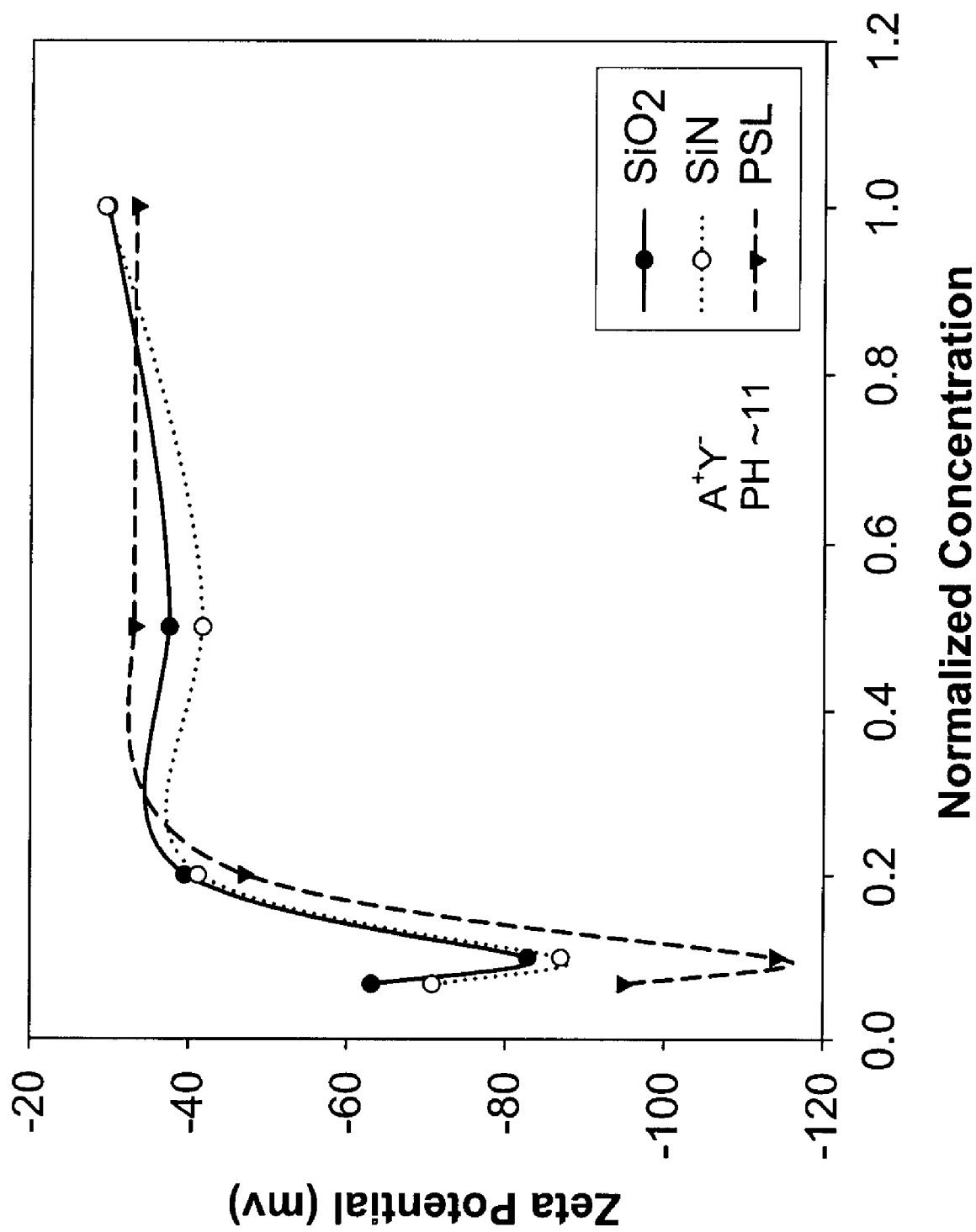
Figure 16:
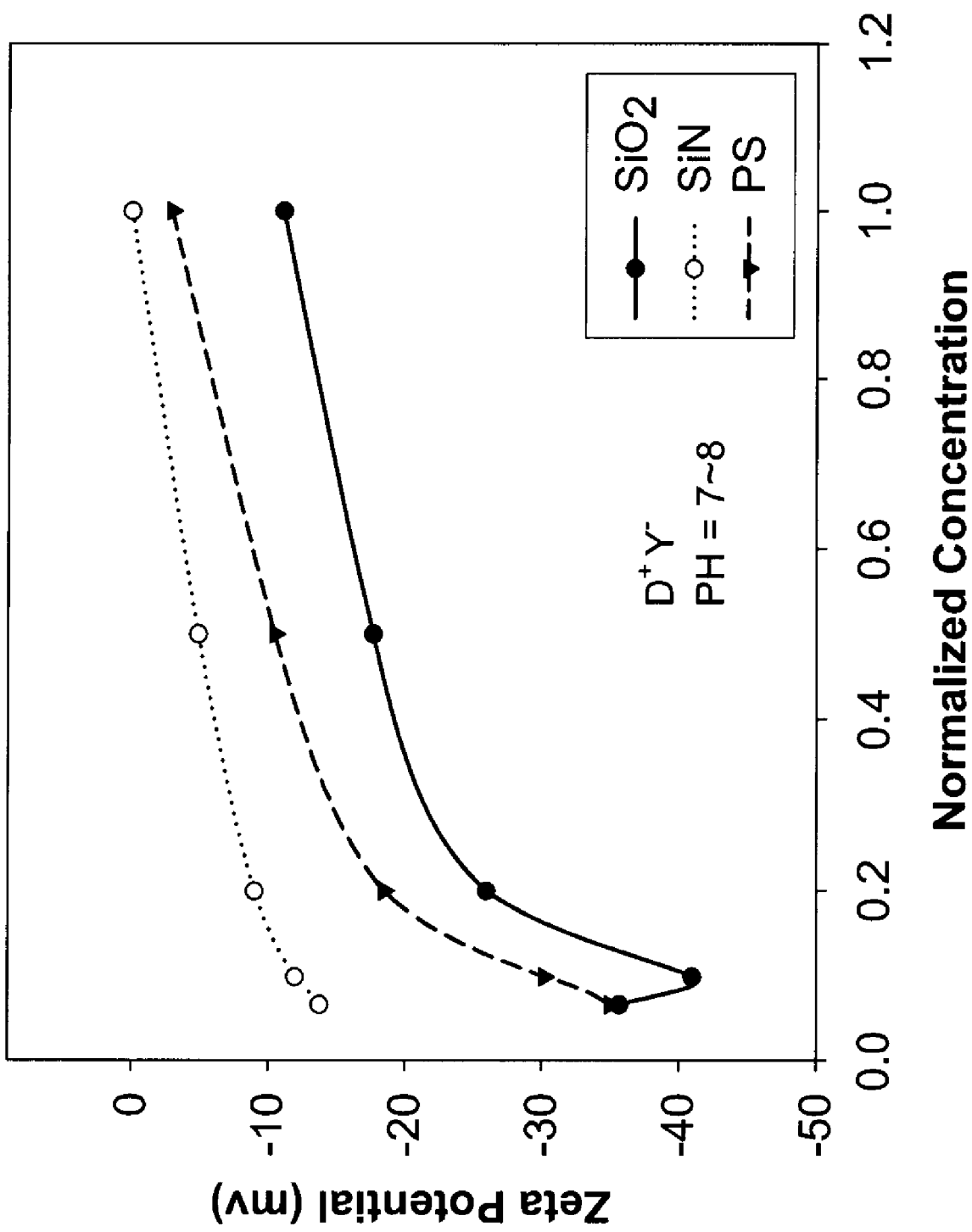
Figure 17:
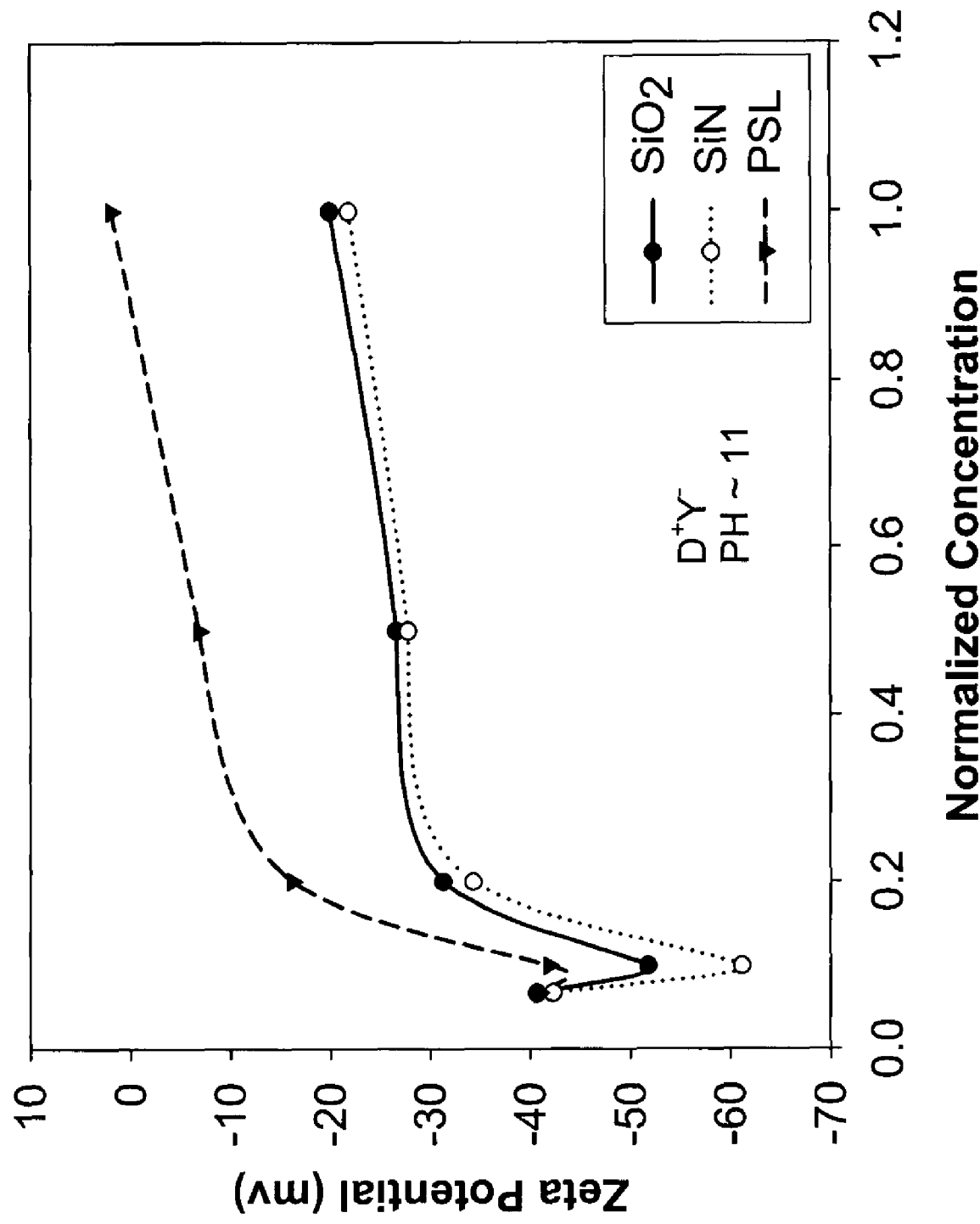

FIGS. 14-17 illustrate the concentration influence on zeta potential at different pH conditions and with different anion and cation sizes for particles consisting of three different materials, where the normalized concentration is varied across a range. In FIGS. 14 and 15, the cation is small, e.g., a tetramethyl ammonium ion, and the anion is large, e.g., chloride. FIG. 14 illustrates the concentration influence on the zeta potential at neutral pH, about pH 7-8, FIG. 15 illustrates the concentration influence on the zeta potential at high pH, about pH 11, with a small cation and a large anion. As is apparent from comparison of the graphs in FIGS. 14 and 15, the high pH condition at low normalized concentration, i.e., about 0.1 C at pH 11, provides a much better zeta potential than at neutral pH or higher concentration. In FIGS. 16 and 17, the cation is large, e.g., a tetrabutyl ammonium ion, and the anion is large, e.g., chloride. FIG. 16 illustrates the concentration influence on the zeta potential at neutral pH, about pH 7-8, FIG. 17 illustrates the concentration influence on the zeta potential at high pH, about pH 11, with a small cation and a large anion. As shown in FIG. 16, the big cation is not optimal, particularly for SiN removal, and the pH and cation size are not optimal. As shown in FIG. 17, the high pH improves the zeta potential, but not as much for the large cation as for the small cation, as shown in FIG. 15.

Figure 18:
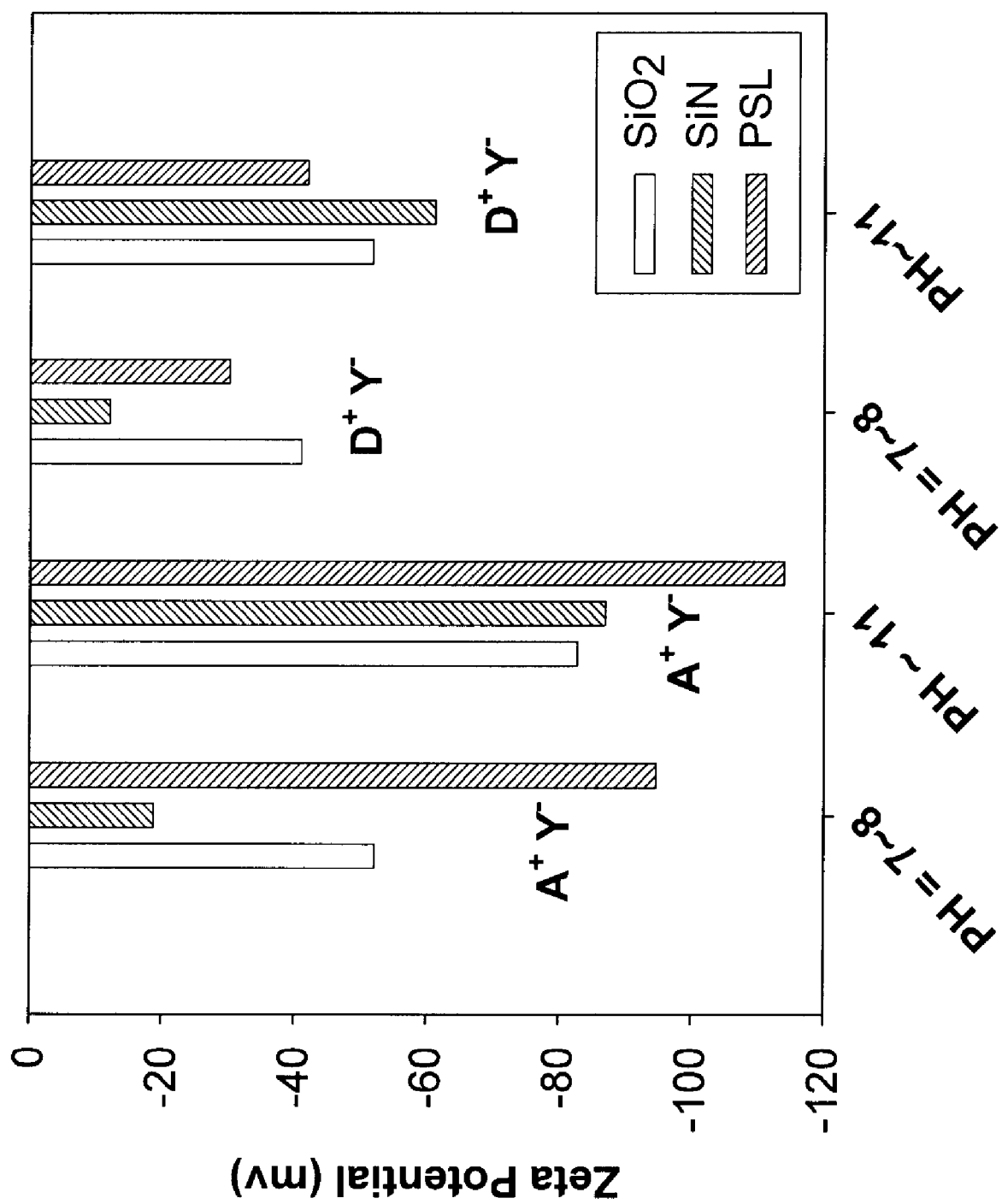
FIG. 18 is a bar graph illustrating the pH influence on the zeta potential at different pH conditions and with different cations for particles consisting of three different materials.

FIG. 18 is a bar graph illustrating the pH influence on the zeta potential at different pH conditions and with different cations for particles consisting of three different materials. As is illustrated in FIG. 18, the optimal zeta potentials are obtained when the cation is small, e.g., tetramethyl ammonium, and the anion is large, and when the pH is high, e.g., at pH 11.

Figure 19:
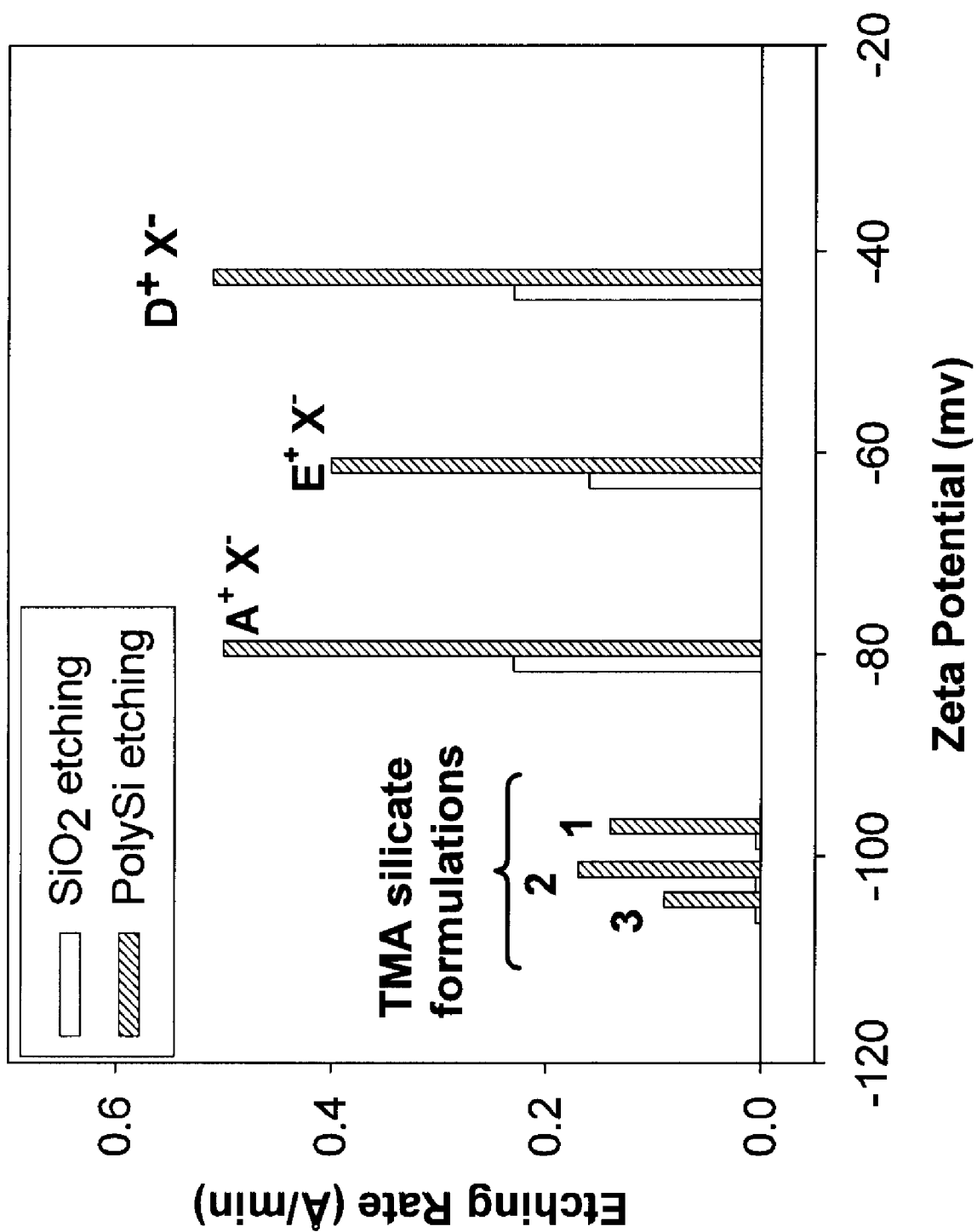
FIG. 19 is a bar graph comparing the etch rate on polysilicon and silicon dioxide between compositions in accordance with embodiments of the present invention and other salt formulations used for removing particles from surfaces formed of polysilicon or silicon dioxide.

FIG. 19 is a bar graph comparing the etch rate on polysilicon and silicon dioxide between compositions in accordance with embodiments of the present invention (the polyhedral silsesquioxanes, here referred to simply as "TMA silicates") and other salt formulations used for removing particles from surfaces formed of polysilicon or silicon dioxide. As is illustrated in FIG. 19, the etching of both polysilicon surfaces and silicon dioxide surfaces is minimized with the polyhedral silsesquioxane of the present invention is used with a small cation, e.g., tetramethyl ammonium. As is illustrated, the etching for the silicon oxide with a polyhedral silsesquioxane salt of the present invention is almost zero, while the etching of the polysilicon is significantly lower than with the other salt formulations.

Figure 20:
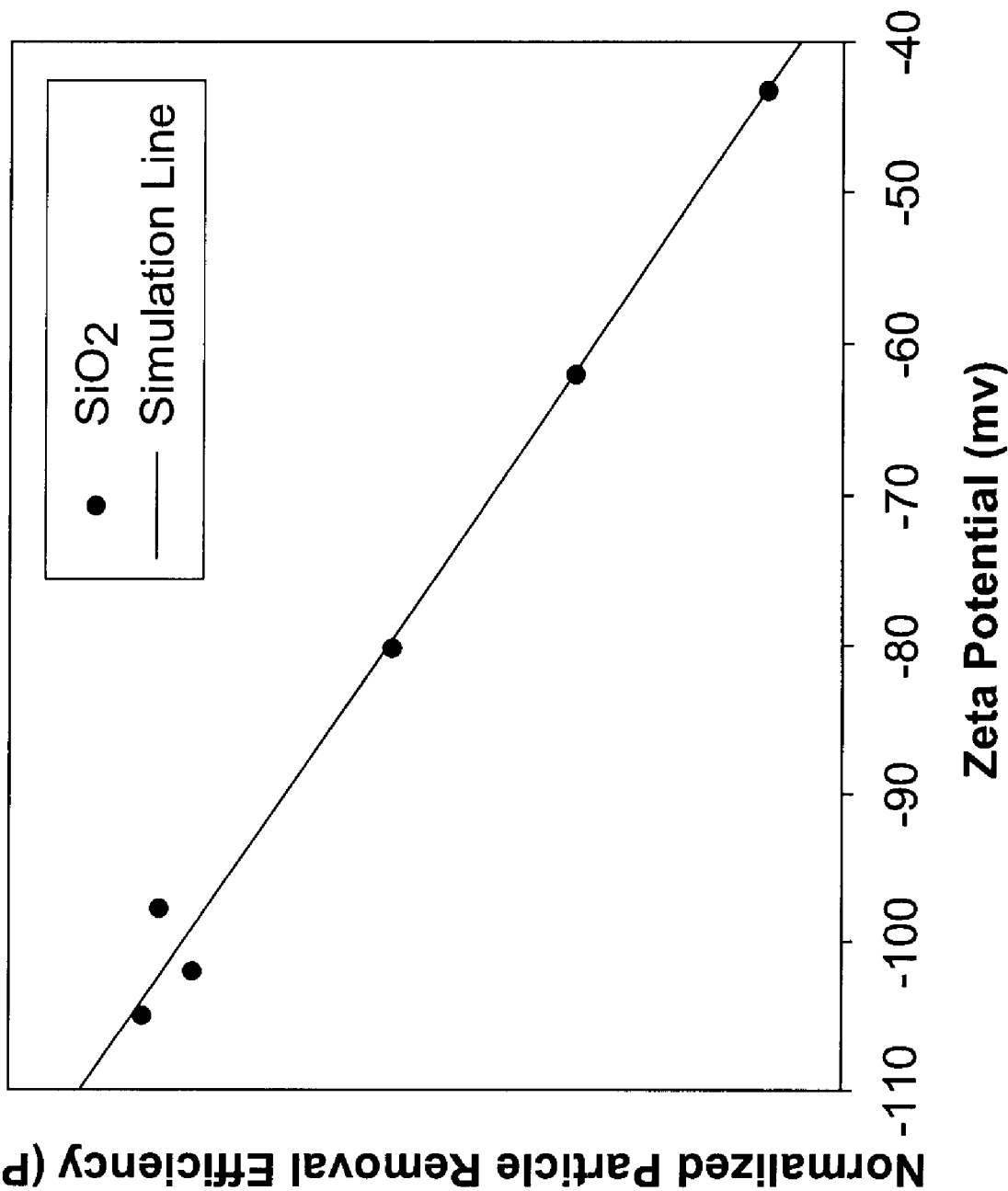
FIG. 20 is a graph illustrating the normalized particle removal efficiency (PRE) versus zeta potential with compositions in accordance with embodiments of the present invention and other salt formulations used for removing particles from surfaces formed of silicon dioxide.

FIG. 20 is a graph illustrating the normalized particle removal efficiency (PRE) versus zeta potential with compositions in accordance with embodiments of the present invention (the onium salt of a polyhedral silsesquioxanes, here referred to simply as "TMA silicates") and other salt formulations used for removing particles from surfaces formed of silicon dioxide. As is clear from FIG. 20, the more negative the value of the zeta potential, the greater the PRE for silicon dioxide particles. In addition, as is clear from FIG. 20, the onium salt of a polyhedral silsesquioxane of the present invention obtains a much improved zeta potential and a higher PRE than do any of the other salt formulations shown in FIG. 20.

Figure 21:
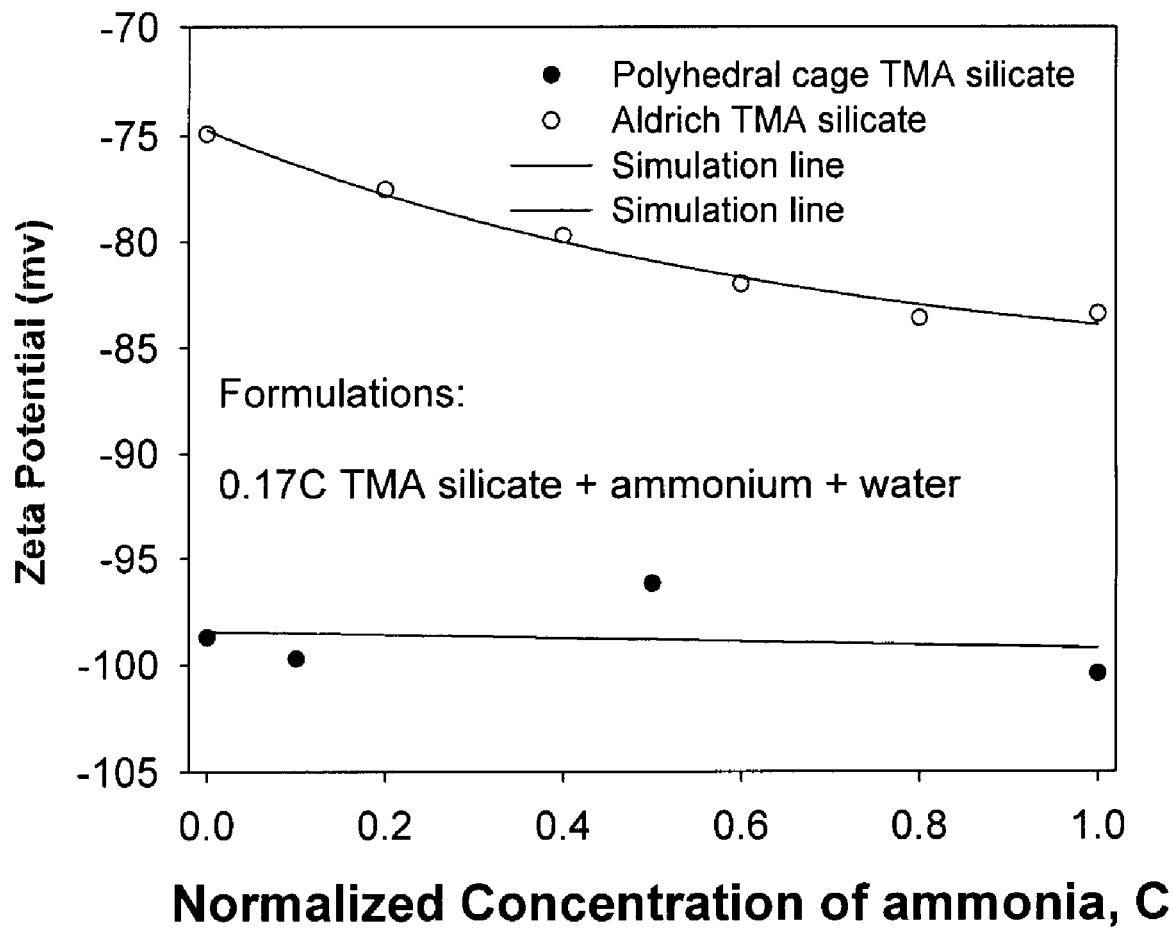
FIG. 21 is a graph illustrating the zeta potential for compositions containing a silicate species and ammonium ions in water, versus normalized ammonia concentration for compositions made from, on one hand, a tetramethyl ammonium salt of a polyhedral silsesquioxane of the present invention, compared, on the other hand, to a commercially available tetramethyl ammonium silicate.

FIG. 21 is a graph illustrating the zeta potential for formulations containing a silicate and ammonium ions in water, versus normalized ammonium concentration for 0.17 C TMA silicates, in which the silicate is, on one hand, an onium salt of a polyhedral silsesquioxane of the present invention or, on the other hand, a commercially available tetramethyl ammonium silicate (from Aldrich), such as that disclosed in U.S. Pat. Nos. 6,020,292 and 6,465,403 B1, As is clearly apparent from the two graphical lines in FIG. 21, the onium salt of a polyhedral silsesquioxane of the present invention provides much improved, i.e., significantly more negative, zeta potential as compared to the prior art tetramethyl ammonium silicate.

Figure 22:
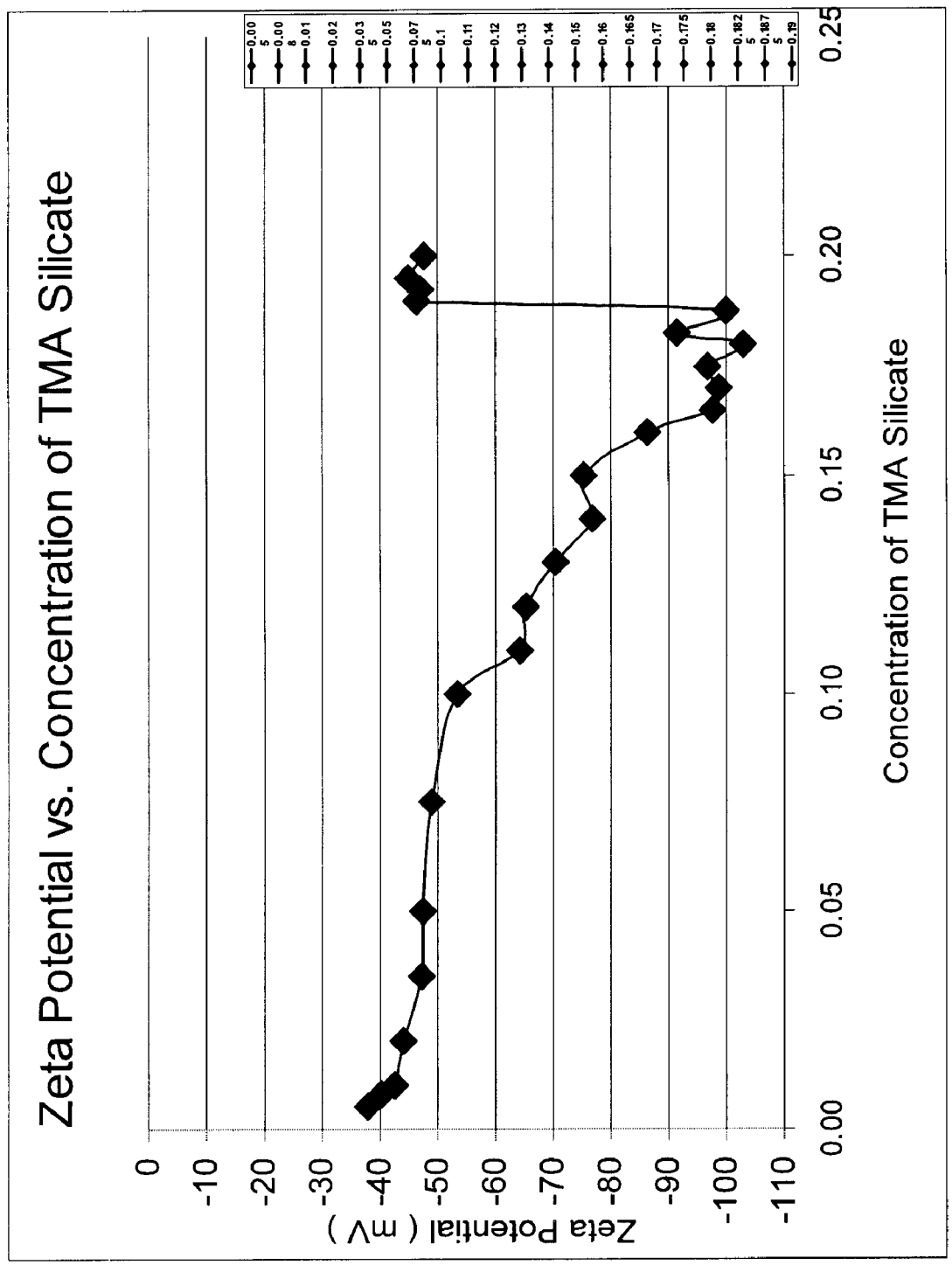
FIG. 22 is a graph of zeta potential versus the concentration of a salt of a polyhedral silsesquioxane in accordance with an embodiment of the present invention.

FIG. 22 is a graph of zeta potential versus the concentration of an onium salt of a polyhedral silsesquioxane in accordance with an embodiment of the present invention. FIG. 22 shows the relationship of an onium salt of a polyhedral silsesquioxane concentration and zeta potential. In FIG. 22, 'C.' represents the normalized concentration and zeta potential obtained with SiN particles as test particles for particle removal. As is apparent from the graph in FIG. 22, there is a minimum concentration window ranging from about 0.16 C to about 0.185 C, within which, in one embodiment, a value of about 0.17 C is a useful average concentration. It is noted that, while the range from about 0.16 C to about 0.185 C provides a desirably low value of zeta potential in the illustrated embodiment, in other embodiments the range may vary from this value. In other embodiments, the concentration of the polyhedral silsesquioxane salt may range from about 0.1 C to about 0.5 C, and in other embodiments, the concentration of the polyhedral silsesquioxane salt may range from about 0.125 C to about 0.3 C, and in other embodiments, the concentration of the polyhedral silsesquioxane salt may range from about 0.15 C to about 0.25 C. Higher concentrations of the polyhedral silsesquioxane salt may be used in some embodiments.

Figure 23:
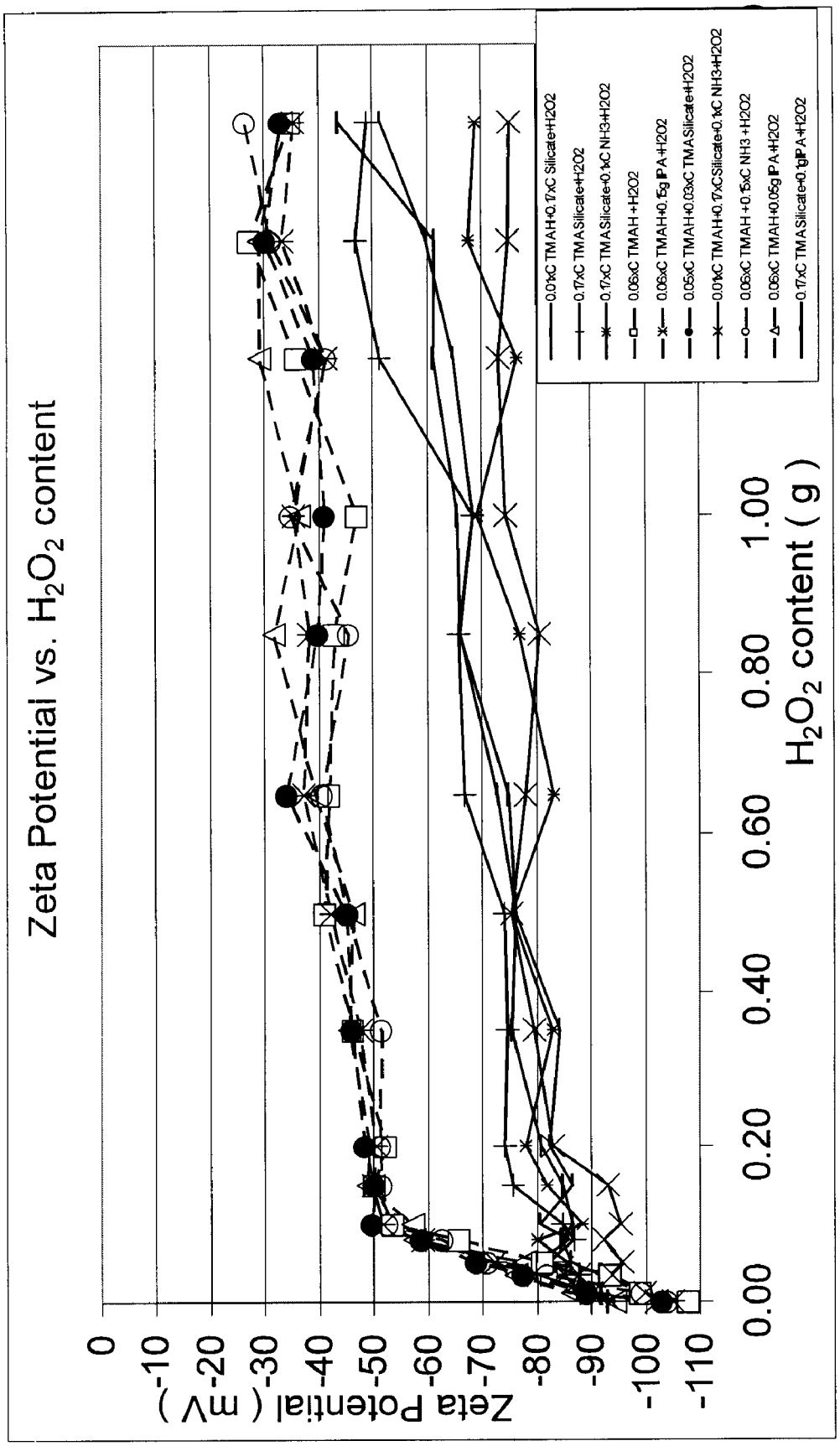
FIG. 23 is a graph of zeta potential versus hydrogen peroxide content for several compositions in accordance with embodiments of the present invention and for several compositions not in accordance with the present invention.

FIG. 23 is a graph of zeta potential versus hydrogen peroxide content for several compositions in accordance with embodiments of the present invention and for several compositions not in accordance with the present invention. FIG. 23 illustrates the zeta potential enhancement realized with the composition of the present invention, including the polyhedral silsesquioxane, referred to in FIG. 23 as the "caged TMA silicate". FIG. 23 shows the zeta potential variation for various formulations as a function of the oxidizer concentration. The zeta potentials shown in FIG. 23 were obtained with SiN particles. As shown in FIG. 23, the graph shows curves separated into two groups. The formulations containing the onium salt of a polyhedral silsesquioxane, referred to in the graph as "caged TMA silicate component", shows much more negative zeta potential, demonstrating a significant and surprising enhancement of the zeta potential due to the inclusion in the composition of the onium salt of a polyhedral silsesquioxane of the present invention.

In one embodiment, the composition of the present invention is substantially free of dimethyl sulfoxide. In one embodiment, the composition of the present invention is substantially free of sulfolane. In one embodiment, the composition of the present invention is substantially free of a piperidone.

It is noted that, throughout the specification and claims, the numerical limits of the disclosed ranges and ratios may be combined, and are deemed to include all intervening values. Thus, for example, where ranges of 1-100 and 10-50 are specifically disclosed, ranges of 1-10, 1-50, 10-100 and 50-100 are deemed to be within the scope of the disclosure, as are the intervening integral values. Furthermore, all numerical values are deemed to be preceded by the modifier "about", whether or not this term is specifically stated. Finally, all possible combinations of disclosed elements and components are deemed to be within the scope of the disclosure, whether or not specifically mentioned, since it is not possible to enumerate every possible combination and/or permutation of ingredients. Thus, it is considered and the skilled person will recognize that each and every combination and permutation of the disclosed members of each element of the disclosed invention is within the scope of the disclosure in accordance with, e.g., EPC 123(2).

While the principles of the invention have been explained in relation to certain particular embodiments, and are provided for purposes of illustration, it is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the claims.

The invention claimed is:

1. A composition comprising:
   (a) one or more metal ion-free base;
   (b) a water-soluble metal ion-free salt of a polyhedral silsesquioxane;
   (c) an oxidizing agent; and
   (d) metal ion-free water.

2. The composition of claim 1 wherein the water-soluble metal ion-free polyhedral silsesquioxane (b) is present as a water-soluble metal ion-free onium salt of a polyhedral silsesquioxane, wherein the onium has a general formula:

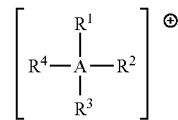

wherein each of $R^1$, $R^2$, $R^3$ and $R^4$ is independently H, an alkyl, alkoxy or alkanol $C_1$-$C_{18}$ group, and A=N or P.

3. The composition of claim 2 wherein the polyhedral silsesquioxane (b) has general formula:

wherein n is in the range from about 6 to about 20.

4. The composition of claim 2 wherein the polyhedral silsesquioxane (b) has a formula $Si_8O_{20}^{8-}$, and structure (I):

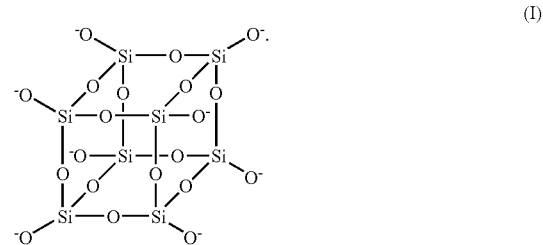

5. The composition of claim 1 wherein the composition has a pH in the range from about 8 to about 14.

6. The composition of claim 1 wherein the composition comprises from about 0.001 wt. % to about 40 wt. % of (b).

7. The composition of claim 1 wherein the composition comprises from about 0.01 wt. % to about 10 wt. % of the oxidizing agent.

8. The composition of claim 1 wherein the metal ion-free base comprises ammonia, an onium hydroxide or any combination of two or more thereof.

9. The composition of claim 8 wherein the onium hydroxide has a general formula (III):

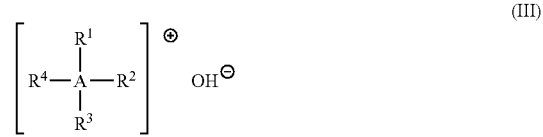

wherein in (III), each of $R^1$, $R^2$, $R^3$ and $R^4$ is independently H, an alkyl, alkoxy or alkanol group including $C_1$-$C_{18}$, and A=N or P.

10. The composition of claim 2 wherein A=N and each of $R^1$, $R^2$, $R^3$ and $R^4$ are alkyl.

11. The composition of claim 10 wherein the alkyl is methyl or ethyl.

12. The composition of claim 2 wherein A=P and each of $R^1$, $R^2$, $R^3$ and $R^4$ are alkyl.

13. The composition of claim 12 wherein the alkyl is methyl or ethyl.

14. The composition of claim 1 wherein the composition further comprises a metal chelating agent.

15. The composition of claim 1 wherein the polyhedral silsesquioxane has a general formula:

wherein n is in the range from about 6 to about 20.

16. The composition of claim 1 wherein the oxidizing agent comprises hydrogen peroxide, ozone, a non-metal hypochlorite salt, or a combination of any two or more thereof.

17. The composition of claim 1 wherein the polyhedral silsesquioxane has a formula $Si_8O_{20}^{8-}$, and structure (I):

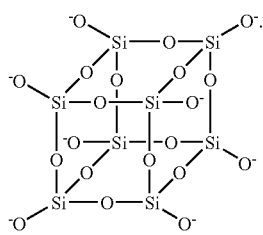

(I)

18. The composition of claim 1 wherein the water-soluble metal ion-free polyhedral silsesquioxane is obtained from the reaction of a quaternary onium hydroxide with silicon dioxide in a substantially 1:1 stoichiometric ratio.

19. A process for removing particulate matter from a surface of an integrated circuit device, comprising applying to the surface the composition of claim 1.

20. A process for removing particulate matter from a surface of an integrated circuit device during fabrication thereof, comprising:

applying to the surface a composition comprising:
(a) one or more metal ion-free base;
(b) a water-soluble metal ion-free salt of a polyhedral silsesquioxane;
(c) an oxidizing agent; and
(d) metal ion-free water; and rinsing the surface with metal ion-free water.

21. The process of claim 20 wherein the water-soluble metal ion-free polyhedral silsesquioxane (b) is present as a water-soluble metal ion-free onium salt of a polyhedral silsesquioxane, wherein the onium has a general formula:

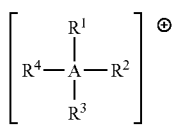

wherein each of $R^1$, $R^2$, $R^3$ and $R^4$ is independently H, an alkyl, alkoxy or alkanol $C_1$-$C_{18}$ group, and A=N or P.

22. The process of claim 21 wherein the water-soluble metal ion-free onium salt of a polyhedral silsesquioxane (b) has general formula

wherein n is in the range from about 6 to about 20.

23. The process of claim 21 wherein the polyhedral silsesquioxane (b) has a formula $Si_8O_{20}^{8-}$, and structure (I):

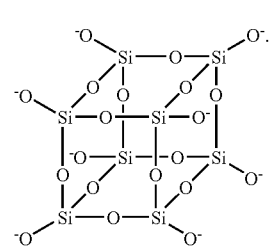

(I)

24. The process of claim 20 wherein the composition has a pH in the range from about 8 to about 14.

25. The process of claim 20 wherein the composition comprises from about 0.001 wt. % to about 40 wt. % of (b).

26. The process of claim 20 wherein the composition comprises from about 0.01 wt. % to about 10 wt. % of the oxidizing agent.

27. The process of claim 20 wherein the metal ion-free base comprises ammonia, an onium hydroxide or any combination of two or more thereof.

28. The process of claim 27 wherein the onium hydroxide has a general formula (III):

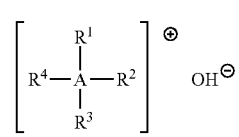

(III)

wherein in (III), each of $R^1$, $R^2$, $R^3$ and $R^4$ is independently H, an alkyl, alkoxy or alkanol group including $C_1$-$C_{18}$, and A=N or P.

29. The process of claim 21 wherein A=N and each of $R^1$, $R^2$, $R^3$ and $R^4$ are alkyl.

30. The process of claim 29 wherein the alkyl is methyl or ethyl.

31. The process of claim 21 wherein A=P and each of $R^1$, $R^2$, $R^3$ and $R^4$ are alkyl.

32. The process of claim 31 wherein the alkyl is methyl or ethyl.

33. The process of claim 20 wherein the composition further comprises a metal chelating agent.

34. The process of claim 20 wherein the polyhedral silsesquioxane has a general formula:

wherein n is in the range from about 6 to about 20.

35. The process of claim 20 wherein the oxidizing agent comprises hydrogen peroxide, ozone, a metal-free hypochlorite salt or a combination of any two or more thereof.

36. The process of claim 20 wherein the polyhedral silsesquioxane has a formula $Si_8O_{20}^{8-}$, and structure (I):

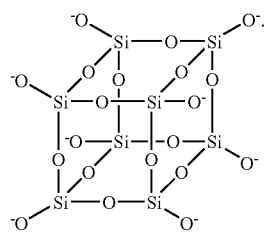

(I)

37. The process of claim 20 wherein the particulate matter comprises nanoparticles.

38. The process of claim 20 wherein the particulate matter comprises a major portion of particles having a particle size in the range from about 0.1 nm to about 80 nm.

39. The process of claim 20 wherein the composition exhibits a zeta potential for nanoparticles adhered to the integrated circuit device substantially lower than a zeta potential of a composition comprising tetraalkyl ammonium silicate as substantially the only silicate.

40. The process of claim 20 wherein the integrated circuit device comprises at least one dielectric material and the composition exhibits substantially no etching of the dielectric material.

41. The process of claim 20 wherein the integrated circuit device comprises at least one silicon material and the composition exhibits substantially no etching of the silicon material.

42. The process of claim 20 wherein the integrated circuit device comprises at least one metal and the composition exhibits substantially no etching of the metal.

43. The process of claim 20 wherein the providing further comprises preparing the water-soluble metal ion-free polyhedral silsesquioxane by reacting a quaternary onium hydroxide with silicon dioxide in a substantially 1:1 stoichiometric ratio.

44. A composition obtained by combining ingredients comprising:
 (a) one or more metal ion-free base;
 (b) a water-soluble metal ion-free salt of a polyhedral silsesquioxane;
 (c) an oxidizing agent; and
 (d) metal ion-free water.

45. The composition of claim 44 wherein the water-soluble metal ion-free polyhedral silsesquioxane is obtained by reacting a quaternary onium hydroxide with silicon dioxide in a substantially 1:1 stoichiometric ratio.

46. A process for removing particulate matter from a surface of an integrated circuit device during fabrication thereof, comprising:
 providing a composition by combining ingredients comprising:
  (a) one or more metal ion-free base;
  (b) a water-soluble metal ion-free salt of a polyhedral silsesquioxane;
  (c) an oxidizing agent; and
  (d) metal ion-free water;
 applying the provided composition to the surface; and
 rinsing the surface with metal ion-free water.

47. The process of claim 46 wherein the providing further comprises preparing the water-soluble metal ion-free polyhedral silsesquioxane by reacting a quaternary onium hydroxide with silicon dioxide in a substantially 1:1 stoichiometric ratio.

* * * * *